US010054861B2

(12) United States Patent
Yabu

(10) Patent No.: US 10,054,861 B2
(45) Date of Patent: Aug. 21, 2018

(54) EXTREME ULTRAVIOLET LIGHT GENERATING APPARATUS AND METHOD FOR GENERATING EXTREME ULTRAVIOLET LIGHT

(71) Applicant: Gigaphoton Inc., Tochigi (JP)

(72) Inventor: Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/480,190

(22) Filed: Apr. 5, 2017

(65) Prior Publication Data
US 2017/0205713 A1    Jul. 20, 2017

Related U.S. Application Data

(63) Continuation of application No. PCT/JP2014/080517, filed on Nov. 18, 2014.

(51) Int. Cl.
*G03B 27/72* (2006.01)
*G03F 7/20* (2006.01)

(52) U.S. Cl.
CPC ........ *G03F 7/7055* (2013.01); *G03F 7/70025* (2013.01); *G03F 7/70033* (2013.01)

(58) Field of Classification Search
CPC . G03F 7/70025; G03F 7/7055; G03F 7/70033
USPC ............... 355/67–71; 250/504, 492.2, 574
See application file for complete search history.

(56) References Cited

U.S. PATENT DOCUMENTS

| 7,068,367 B2 | 6/2006 | Stobrawa et al. |
| 7,589,337 B2 | 9/2009 | Bykanov et al. |
| 2012/0080584 A1 | 4/2012 | Partlo et al. |

(Continued)

FOREIGN PATENT DOCUMENTS

| JP | 2012-199360 A | 9/2012 |
| JP | 2014-086523 A | 5/2014 |

(Continued)

OTHER PUBLICATIONS

International Search Report issued in PCT/JP2014/080517; dated Feb. 24, 2015.

(Continued)

*Primary Examiner* — Hung Henry Nguyen
(74) *Attorney, Agent, or Firm* — Studebaker & Brackett PC

(57) ABSTRACT

An extreme ultraviolet light generating apparatus may include: a chamber, in which extreme ultraviolet light is generated; a target supply unit that outputs a target into the chamber as droplets to supply the target to a plasma generating region; a stage that moves the target supply unit in a direction substantially perpendicular to the trajectory of droplets output from the target supply unit; a droplet detector provided between the target supply unit and the plasma generating region at an inclination of a predetermined angle with respect to a substantially vertical direction, that detects the droplets from a direction inclined at the predetermined angle; and a calculation control unit that controls the irradiation timings of the laser beam at which the laser beam is irradiated onto the droplets within the plasm generating region, by adding delay times to the timings at which the droplets are detected by the droplet detector.

17 Claims, 24 Drawing Sheets

(56) References Cited

U.S. PATENT DOCUMENTS

| | | | |
|---|---|---|---|
| 2013/0119232 A1* | 5/2013 | Moriya | G01J 1/4257 250/201.1 |
| 2014/0111635 A1 | 4/2014 | Suzuki et al. | |
| 2014/0353528 A1 | 12/2014 | Hayashi et al. | |
| 2015/0189730 A1* | 7/2015 | Moriya | H05G 2/005 250/574 |
| 2015/0342015 A1 | 11/2015 | Hayashi et al. | |

FOREIGN PATENT DOCUMENTS

| | | |
|---|---|---|
| JP | 2014-235805 A | 12/2014 |
| WO | 2014/042003 A1 | 3/2014 |

OTHER PUBLICATIONS

Written Opinion issued in PCT/JP2014/080517; dated Feb. 24, 2015.

\* cited by examiner

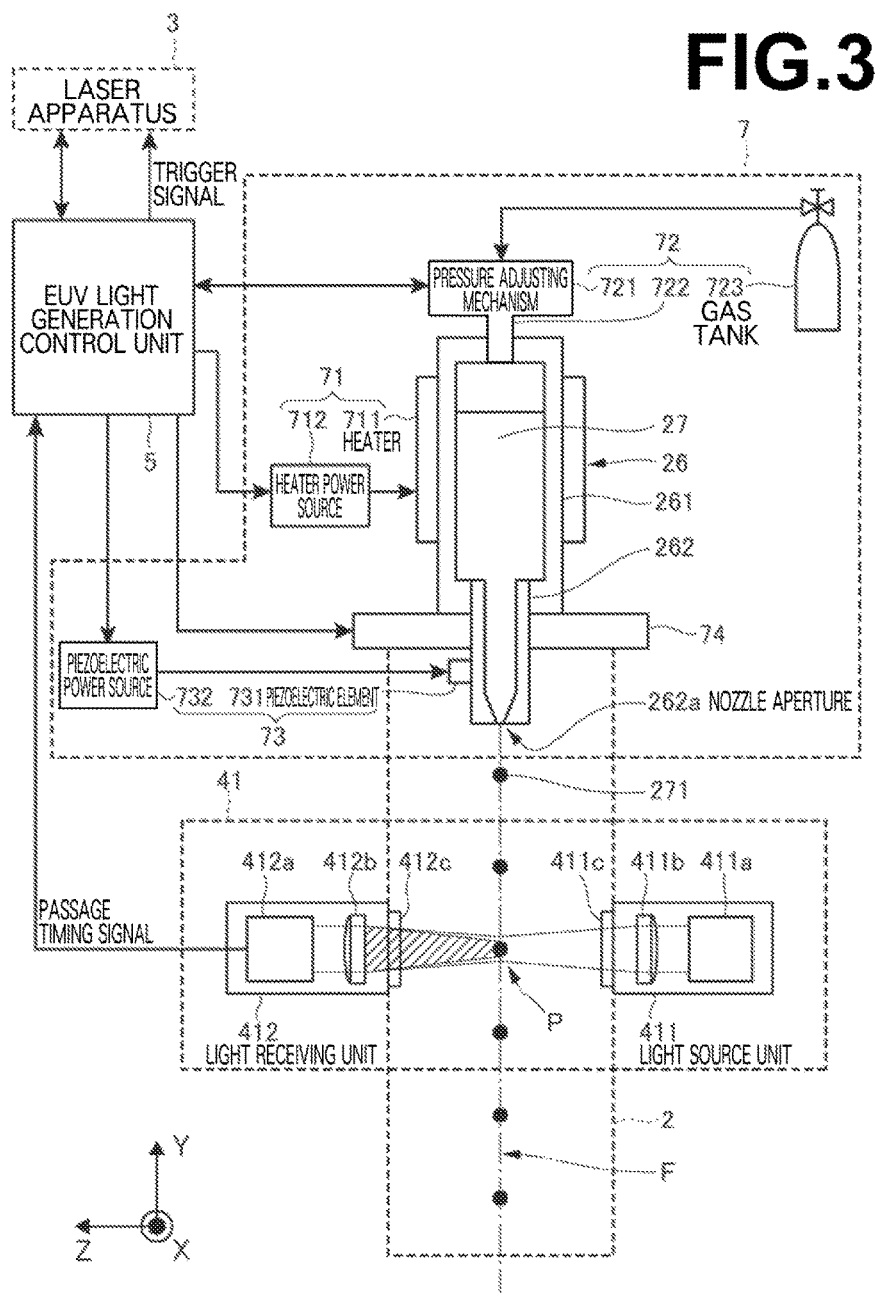

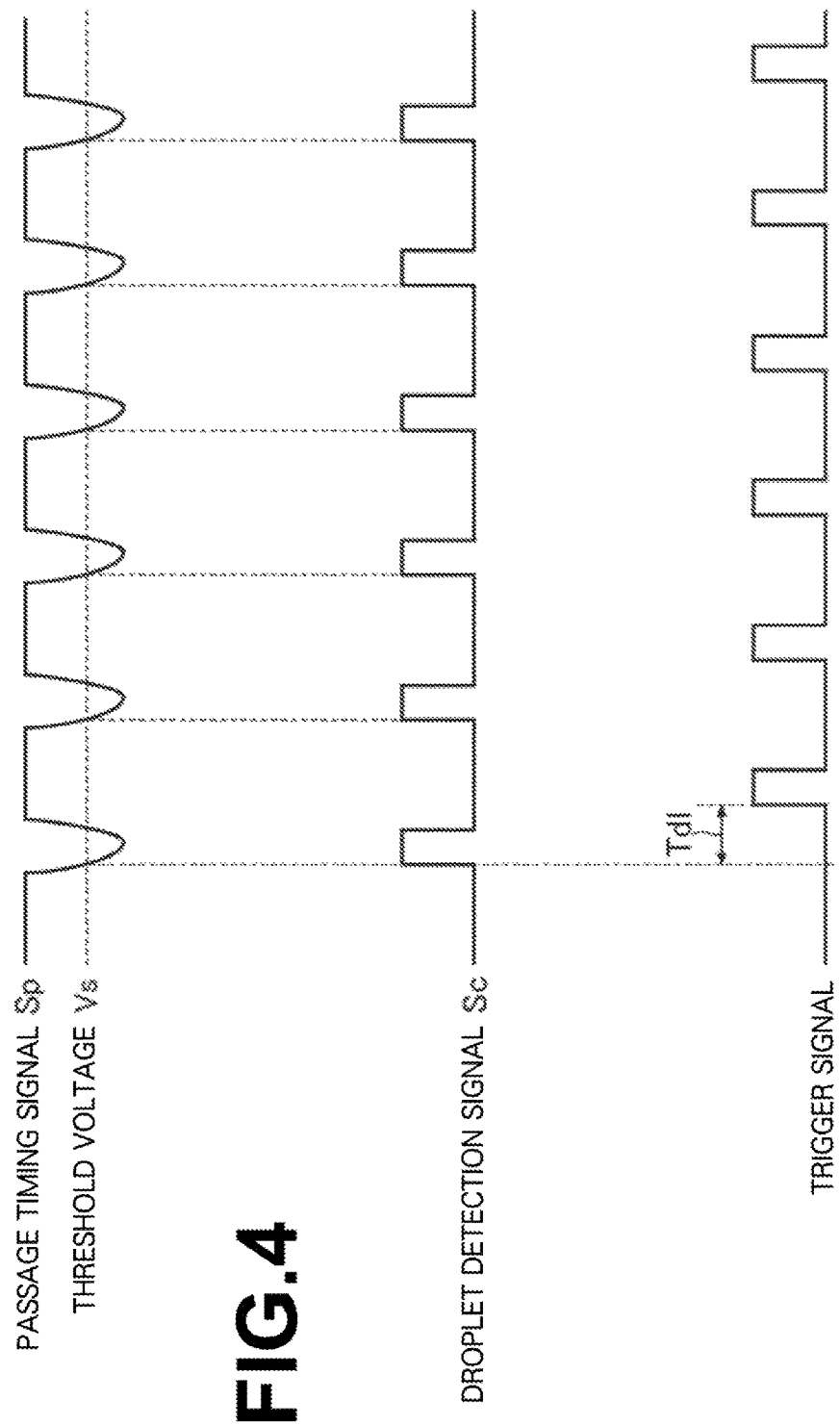

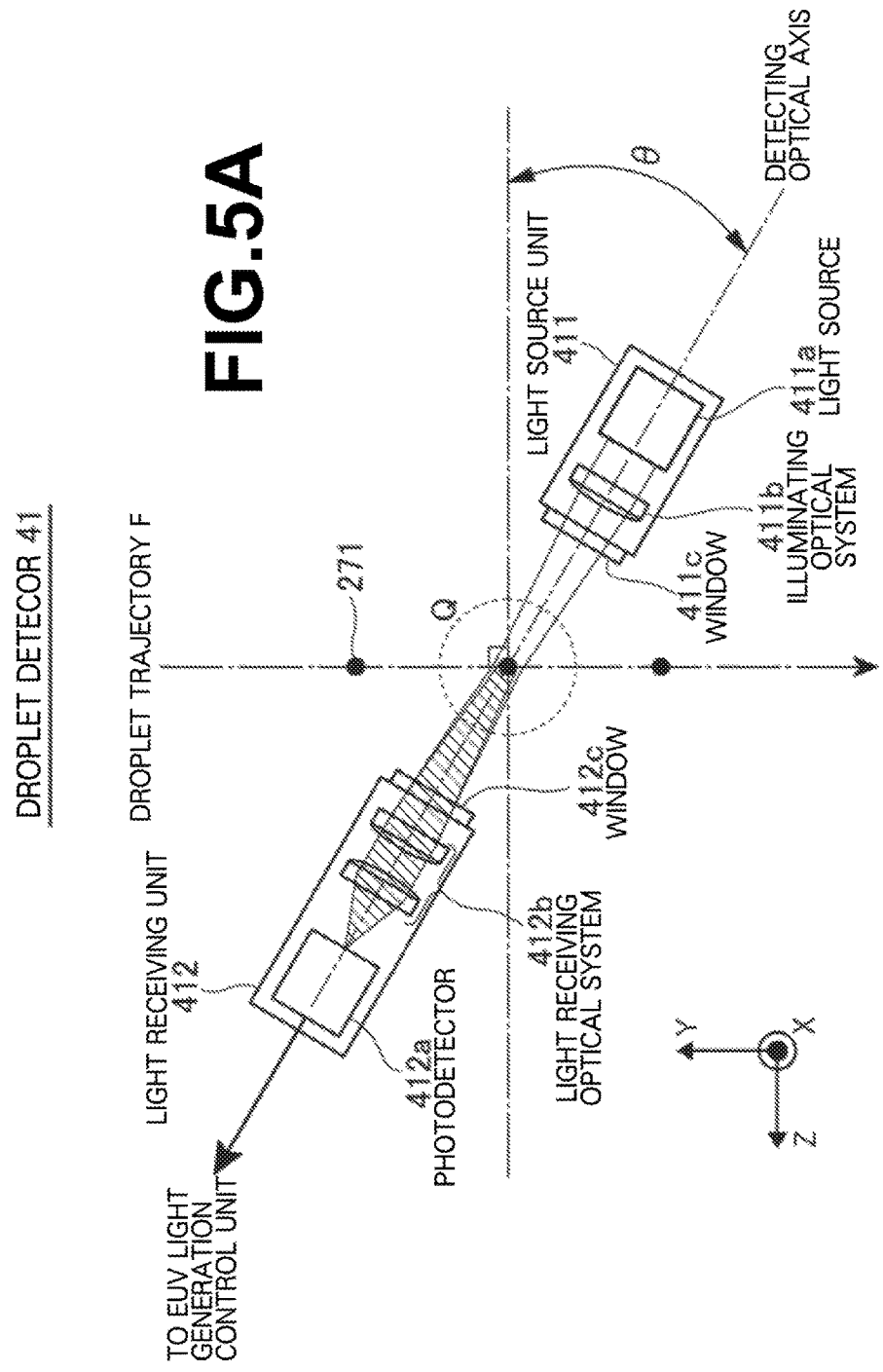

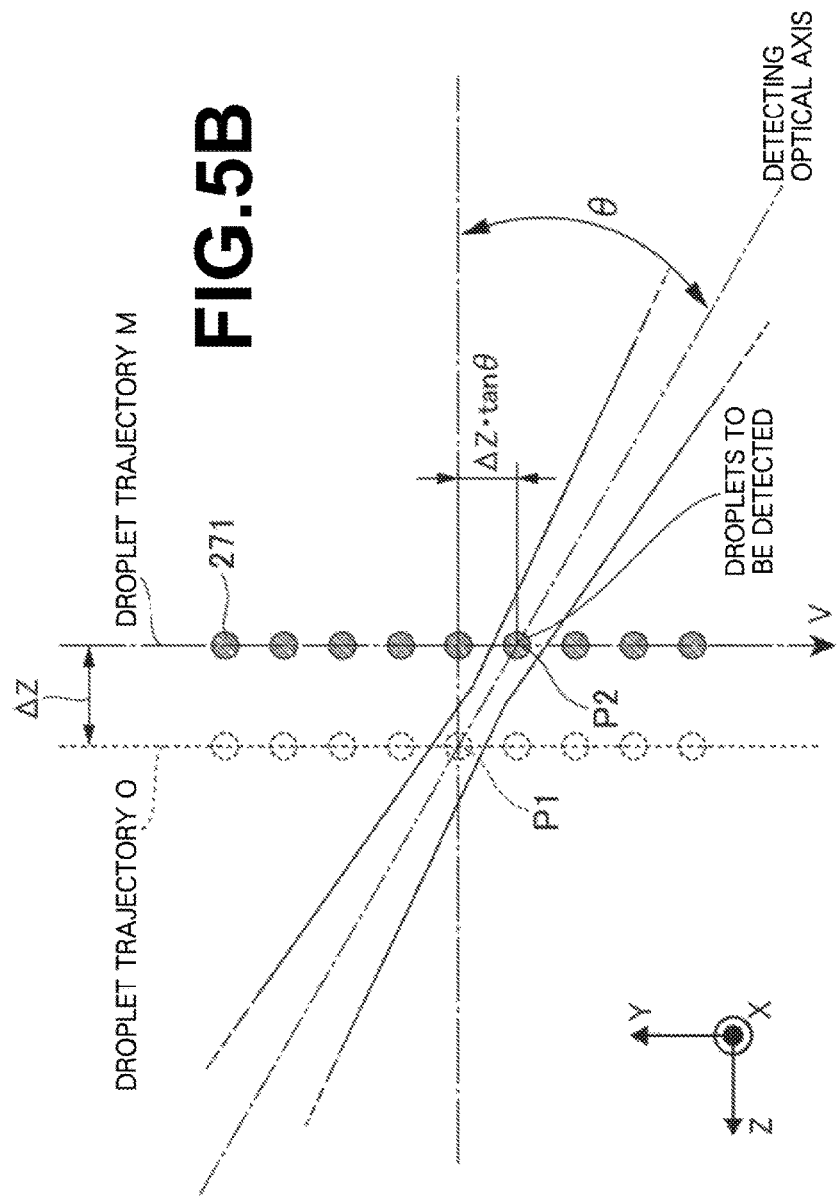

S7 X POSITION CORRECTING PROCESS

S9 Y POSITION CORRECTING PROCESS

FIG.14B
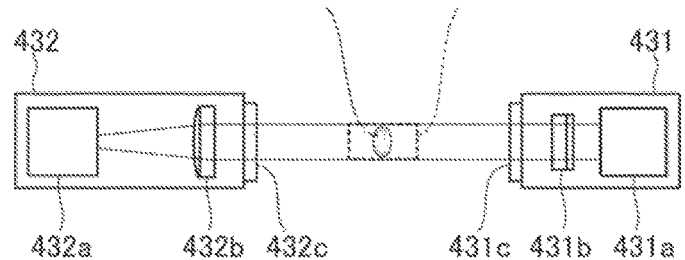
A-A CROSS SECTION
FIG.14C
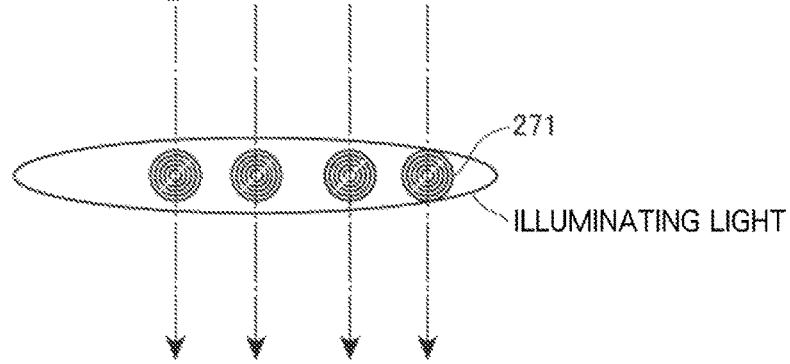
M-M CROSS SECTION

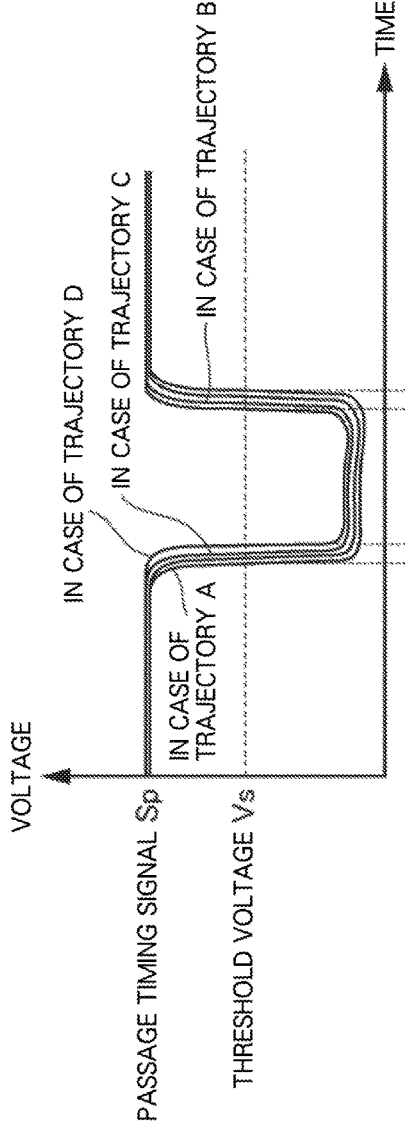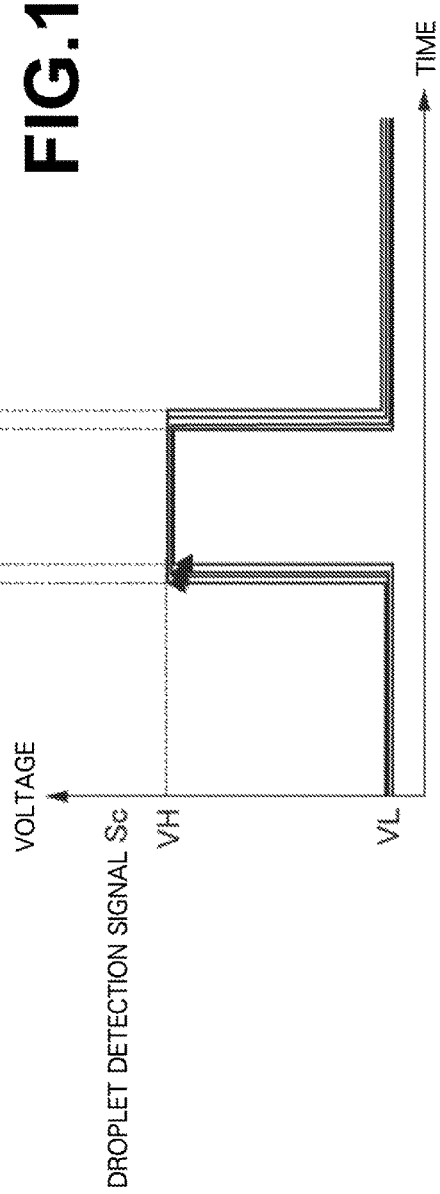
FIG.14D

B-B CROSS SECTION

N-N CROSS SECTION

EXTREME ULTRAVIOLET LIGHT GENERATING APPARATUS AND METHOD FOR GENERATING EXTREME ULTRAVIOLET LIGHT

CROSS REFERENCE TO RELATED APPLICATIONS

The present application is a Continuation application of International Application No. PCT/JP2014/080517 filed on Nov. 18, 2014. The content of the application is incorporated herein by reference in its entirety.

BACKGROUND

1. Technical Field

The present disclosure is related to an apparatus and a method for generating extreme ultraviolet light.

2. Related Art

Recently, as semiconductor processes have become finer, transfer patterns for use in photolithography of semiconductor processes have also become finer. In the next generation, microfabrication at 70 nm to 45 nm, and further, microfabrication at 32 nm or less will be in demand. In order to meet this demand for microfabrication at 32 nm or less, there is expectation for development of an exposure apparatus in which an extreme ultraviolet (EUV) light generating apparatus that generates extreme ultraviolet (EUV) light having a wavelength of approximately 13 nm is combined with a reduced projection reflective optic system.

Three types of EUV light generating apparatuses have been proposed. The three types are: an LPP (Laser Produced Plasma) type apparatus that employs plasma which is generated by irradiating a laser beam onto a target substance; a DPP (Discharge Produced Plasma) type apparatus that employs plasma which is generated by electrical discharge, and an SR (Synchrotron Radiation) type apparatus that employs synchrotron orbital radiation.

RELATED ART DOCUMENTS

Patent Documents

[Patent Document 1]
  U.S. Pat. No. 7,068,367
[Patent Document 2]
  U.S. Pat. No. 7,589,337
[Patent Document 3]
  US Published Patent Application No. 2012/080584
[Patent Document 4]
  International Patent Publication No. WO2014/042003
[Patent Document 5]
  Japanese Patent Application No. 2012-199360
[Patent Document 6]
  Japanese Patent Application No. 2013-114964

SUMMARY

An extreme ultraviolet light generating apparatus according to one aspect of the present disclosure may include:
  a chamber, in which a target supplied into a plasma generating region therein turns into plasma by being irradiated with a laser beam and extreme ultraviolet light is generated;
  a target supply unit configured to output the target into the chamber as droplets so as to supply the target into the plasma generating region;
  a stage that moves the target supply unit in a direction substantially perpendicular to the trajectory of the droplets which are output from the target supply unit;
  a droplet detector provided between the target supply unit and the plasma generating region at an inclination of a predetermined angle with respect to the direction substantially perpendicular to the trajectory of the droplets, configured to detect the droplets from a direction inclined at the predetermined angle;
  and a calculation control unit configured to control the irradiation timings of the laser beam at which the laser beam is irradiated onto the droplets within the plasm generating region, by adding delay times to the timings at which the droplets are detected by the droplet detector.

An extreme ultraviolet light generating method according to one aspect of the present disclosure is a method for generating extreme ultraviolet light by turning a target to plasma by irradiating a laser beam on the target within a plasma generating region, and may include:
  receiving data regarding a specified plasma generating region position for changing the position of the plasma generating region from the exterior;
  moving a target supply unit that supplies the target as droplets to the specified plasma generating region position based on the data;
  moving a laser beam focusing optical system to focus the laser beam at the specified plasma generating region position based on the data;
  outputting the target as the droplets from the target supply unit toward the plasma generating region;
  detecting the droplets with a droplet detector provided at an inclination of a predetermined angle with respect to a direction substantially perpendicular to the trajectory of the droplets;
  calculating a delay time that determines the timings at which trigger signals that cause an external laser device to output the laser beam are output, based on the timings at which the droplets are detected, the distance of movement of the target supply unit, and the predetermined angle; and
  outputting the trigger signals at timings, which are the timings at which the droplets are detected by the droplet detector with the delay time added thereto.

BRIEF DESCRIPTION OF THE DRAWINGS

Embodiments of the present disclosure will be described below as examples, with reference to the attached drawings.

FIG. 3 is a diagram for explaining the configuration of the droplet detector included in the EUV light generating apparatus illustrated in FIG. 2.

FIG. 4 is a time chart that illustrates timings up to a point when a trigger signal is output by an EUV light generating control unit illustrated in FIG. 2.

FIG. 5A is a diagram for explaining the configuration of a droplet detector.

FIG. 5B is a diagram for explaining the relationship between a detecting optical axis in the droplet detector illustrated in FIG. 5A and the trajectory of droplets.

FIG. 14B is a sectional view of the droplet detector taken along the A-A line in FIG. 14A.

FIG. 14C is a sectional view of illuminating light output from a light source unit taken along the M-M line in FIG. 14A.

FIG. 14D illustrates the waveforms of passage timing signals and the like which are generated by a photodetector illustrated in FIG. 14A.

DETAILED DESCRIPTION OF THE PREFERRED EMBODIMENTS

Figure 1:
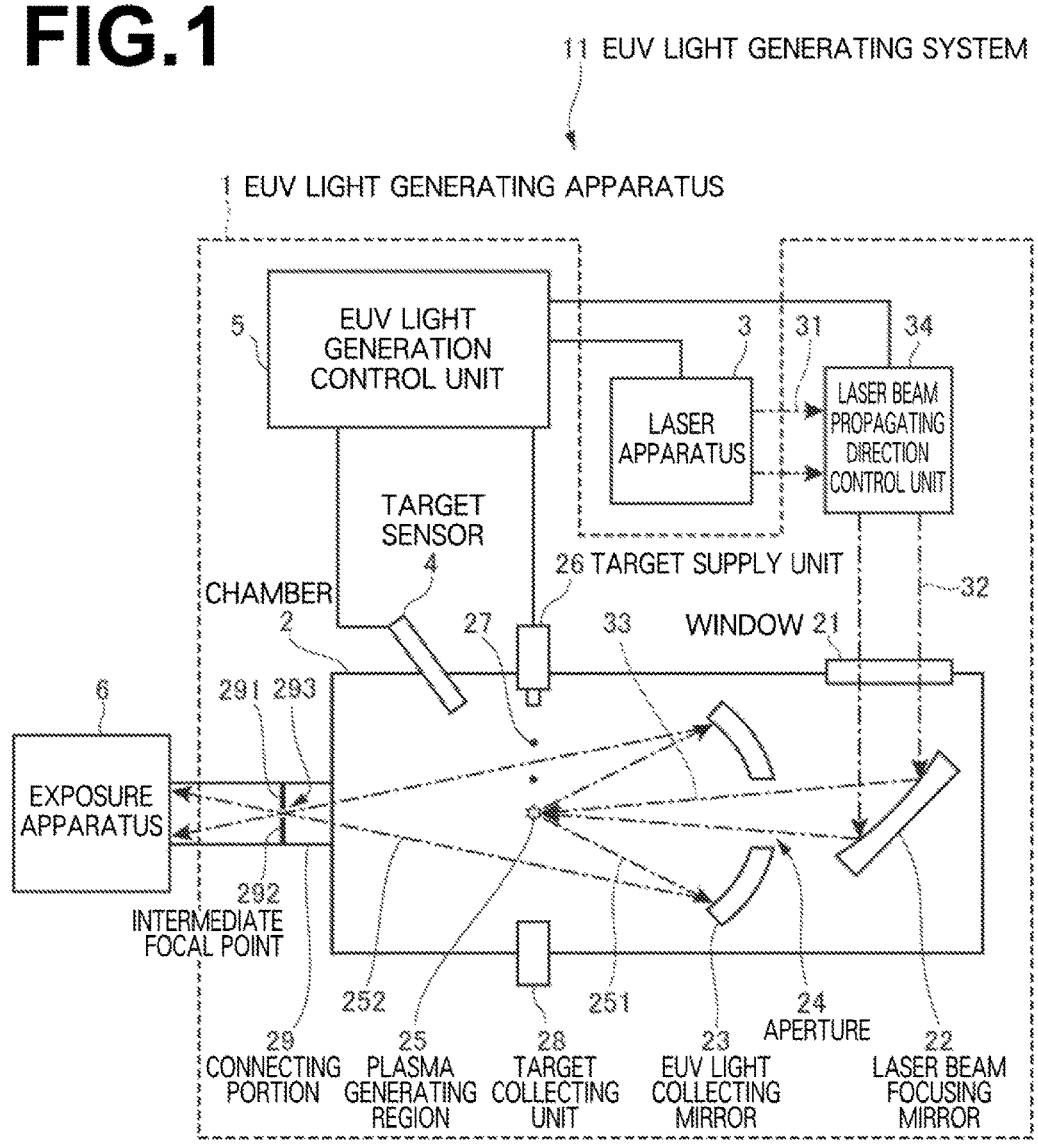
FIG. 1 is a diagram that schematically illustrates the configuration of an exemplary EUV light generating system of the LPP type.

—Contents—
1. Overview
2. Terms
3. Overview of EUV Light Generating System
   3.1 Configuration
   3.2 Operation
4. EUV Light Generating System Including Droplet Detector
   4.1 Configuration
   4.2 Operation
5. Objective
6. Droplet Detector and Calculation Control Unit Included in EUV Light Generating Apparatus According to First Embodiment
   6.1 Configuration
   6.2 Operation
   6.3 Effect
7. Droplet Detector and Calculation Control Unit Included in EUV Light Generating Apparatus According to Second Embodiment
   7.1 Configuration
   7.2 Operation
   7.3 Effect
8. Droplet Detector and Calculation Control Unit Included in EUV Light Generating Apparatus According to Third Embodiment
   8.1 Configuration
   8.2 Operation
   8.3 Effect
9. Droplet Detector and Calculation Control Unit Included in EUV Light Generating Apparatus According to Fourth Embodiment
   9.1 Configuration
   9.2 Operation
   9.3 Effect
10. Image Measuring Device Included in EUV Light Generating Apparatus According to Fifth Embodiment
   10.1 Configuration
   10.2 Operation
   10.3 Effect
11. Hardware Environment of Control Units Embodiments of the present disclosure will be described in detail with reference to the attached drawings. The embodiments to be described below are illustrative examples of the present disclosure, and do not limit the scope of the present disclosure. In addition, not all of the configurations and operations of the embodiments to be described below are necessarily essential configurations and operations of the present disclosure. Note that common constituent elements will be denoted with the same reference numbers, and redundant descriptions will be omitted.

(1. Overview)

The present disclosure discloses at least the embodiments below.

An EUV light generating apparatus 1 of the present disclosure may include: a chamber 2, in which a target 27 supplied into a plasma generating region 25 therein turns into plasma by being irradiated with a laser beam 33 and extreme ultraviolet light is generated; a target supply unit 26 configured to output the target 27 into the chamber 2 as droplets 271 so as to supply the target 27 into the plasma generating region 25; a stage 74 that moves the target supply unit 26 in a direction substantially perpendicular to the trajectory F of the droplets 271 which are output from the target supply unit 26; a droplet detector 41 provided between the target supply unit 26 and the plasma generating region 25 at an inclination of a predetermined angle with respect to the direction substantially perpendicular to the trajectory F of the droplets 271, configured to detect the droplets 271 from a direction inclined at the predetermined angle; and a calculation control unit 51 configured to control the irradiation timings of the laser beam 33 at which the laser beam 33 is irradiated onto the droplets 271 within the plasm generating region 25, by adding delay times to the timings at which the droplets 271 are detected by the droplet detector 41.

By adopting such a configuration, the EUV light generating apparatus 1 of the present disclosure is capable of irradiating the pulsed laser beam 33 onto the droplets 271 at optimal timings, even in cases that the target supply unit 26 moves in a state in which the droplet detector 41 is provided such that a detecting optical axis thereof is inclined.

(2. Terms)

A "target" refers to a substance which is introduced into a chamber and irradiated with a laser beam. The target turns into plasma when irradiated by the laser beam and emits EUV light. A "droplet" refers to one form in which the target is supplied into the chamber. "Plasma light" is radiant light which is emitted by the target which has turned into plasma. This radiant light includes EUV light.

(3. Overview of EUV Light Generating System)

<3.1 Configuration>

FIG. 1 is a diagram that schematically illustrates the configuration of an exemplary EUV light generating system of the LPP type. An EUV light generating apparatus 1 may be employed with at least one laser apparatus 3. In the present disclosure, a system that includes the EUV light generating apparatus 1 and the laser apparatus 3 may be referred to as an EUV light generating system 11. As illustrated in FIG. 1 and described in detail later, the EUV light generating apparatus 1 may include a chamber 2 and a target supply unit 26. The chamber 2 may be capable of being sealed to be gastight. The target supply unit 26 may be mounted on the chamber 2 so as to penetrate through a wall of the chamber 2, for example. The material which is supplied by the target supply unit 26 as a target substance may include, but is not limited to, tin, terbium, gadolinium, lithium, xenon, or any combination including two or more thereof.

A wall of the chamber 2 may have at least one aperture penetrating therethrough. A window 21 may be provided at the aperture. A pulsed laser beam 32 which is output from the laser apparatus 3 may be transmitted through the window 21. An EUV light collecting mirror 23 having a spheroidal reflective surface may be provided in the chamber 2, for example. The EUV light collecting mirror 23 may have a first focal point and a second focal point. The surface of the EUV light collecting mirror 23 may have a multi layered reflective film, in which molybdenum layers and silicon layers are alternately laminated, formed thereon, for example. It is preferable for the EUV light collecting mirror 23 to be provided such that the first focal point is positioned in a plasma generation region 25 and the second focal point is positioned at an intermediate focal (IF) point 292, for example. The EUV light collecting mirror 23 may have an aperture 24 formed at the center thereof, and a pulsed laser beam 33 may pass through the aperture 24.

The EUV light generating apparatus 1 may further include an EUV light generation control unit 5 and a target sensor 4. The target sensor 4 may have an image capturing function and may detect the presence, the trajectory, the position, the velocity, etc. of a target 27.

Further, the EUV light generating apparatus 1 may include a connecting portion 29 that enables the interior of the chamber 2 to be in communication with the interior of an exposure apparatus 6. A wall 291 having an aperture 293 formed therethrough may be provided in the connecting portion 29. The wall 291 may be provided such that the aperture 293 is positioned at the second focal point of the EUV light collecting mirror 23.

The EUV light generating apparatus 1 may additionally include a laser beam propagating direction control unit 34, a laser beam focusing mirror 22, and a target collecting unit 28 for collecting the target 27. The laser beam propagating direction controlling unit 34 may be equipped with an optical element for regulating the propagating direction of a laser beam, and an actuator for adjusting the position, orientation, etc. of the optical element.

<3.2 Operation>

Referring to FIG. 1, the pulsed laser beam 31 which is output from the laser apparatus 3 propagates via the laser beam propagating direction control unit 34, passes through the window 21 as a pulsed laser beam 32, and then enters the chamber 2. The pulsed laser beam 32 may propagate through the chamber 2 along at least one laser beam path, be reflected by the laser beam focusing mirror 22, and be irradiated onto at least one target 27 as the pulsed laser beam 33.

The target supply unit 26 may be configured to output the target 27 toward the plasma generation region 25 in the interior of the chamber 2. At least one pulse which is included in the pulsed laser beam 33 may be irradiated onto the target 27. The target 27 which is irradiated by the pulsed laser beam turns into plasma, and EUV light 251 is emitted from the plasma along with light having other wavelengths. The EUV light 251 may be selectively reflected by the EUV light collecting mirror 23. EUV light 252 which is reflected by the EUV light collecting mirror 23 may be focused at the intermediate focal point 292, and output to the exposure apparatus 6. Note that a plurality of pulses which are included in the pulsed laser beam 33 may be irradiated onto a single target 27.

An EUV light generation control unit 5 may be configured to totally control the entire EUV light generating system 11. The EUV light generation control unit 5 may be configured to process image data of the target 27 captured by the target sensor 4 or the like. In addition, the EUV light generation control unit 5 may control at least one of the timing at which the target 27 is output and the output direction of the target 27, for example. Further, the EUV light generation control unit 5 may control at least one of the output timing of the laser apparatus 3, the propagating direction of the pulsed laser beam 32, and the focal position of the pulsed laser beam 33, for example. The above items which are controlled are merely examples, and other additional items may be controlled as necessary.

(4. EUV Light Generating Apparatus Including Droplet Detector)

<4.1 Configuration>

Figure 2:
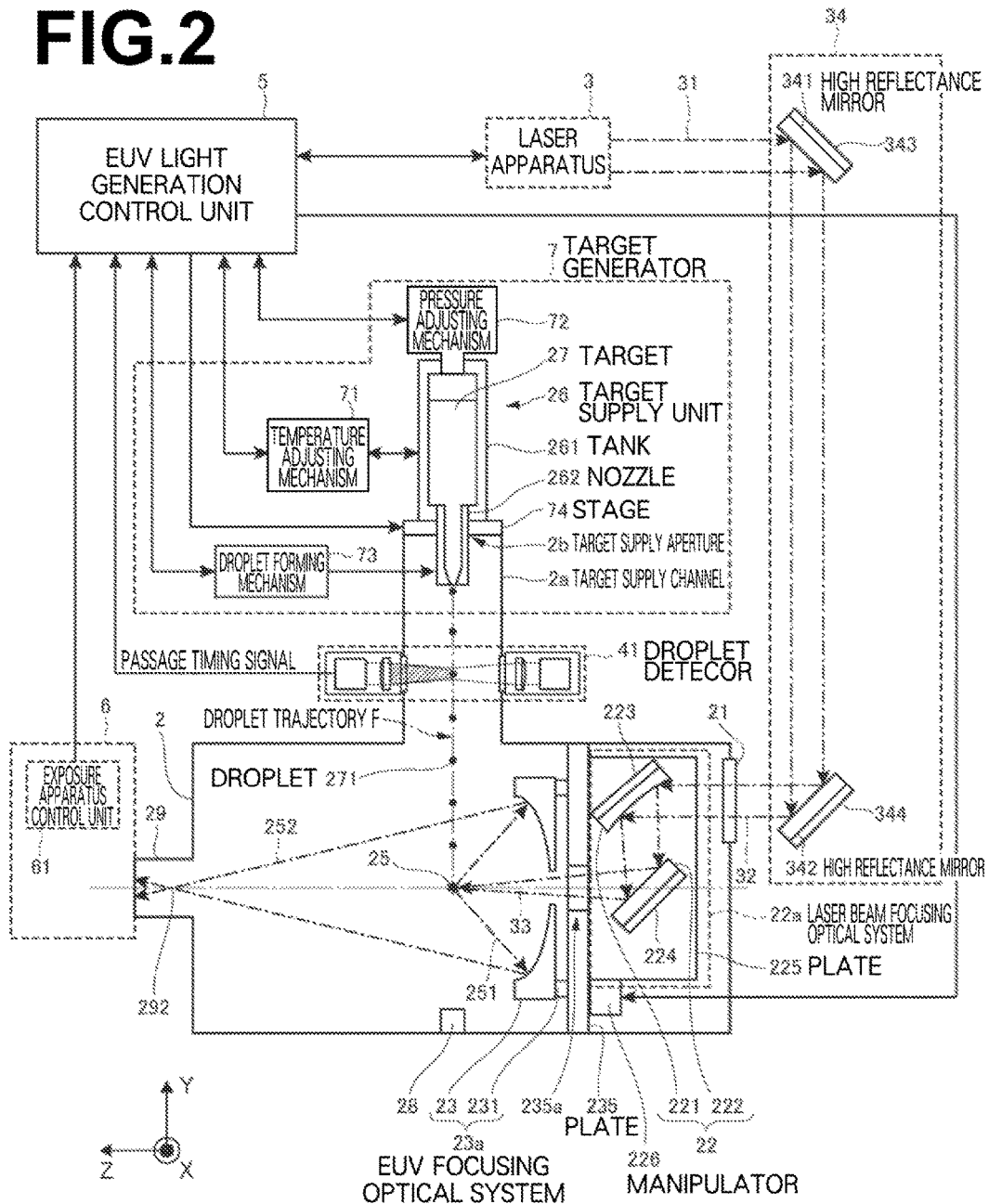
FIG. 2 is a diagram that illustrates the configuration of an EUV light generating apparatus that includes a droplet detector.

The configuration of the EUV light generating apparatus 1 that includes the droplet detector 41 will be described with reference to FIG. 2 and FIG. 3. The direction in which EUV light 252 is guided from the chamber 2 of the EUV light generating apparatus 1 to the exposure apparatus 6 in FIG. 2 is designated as the Z axis. The X axis and the Y axis are axes which are perpendicular to the Z axis and perpendicular to each other as well. The coordinate axes in the other drawings are the same as those of FIG. 2.

The chamber 2 of the EUV light generating apparatus 1 may be of a hollow spherical shape or a cylindrical shape. The direction of the central axis of the cylindrical chamber 2 may be the direction in which the EUV light 252 is guided toward the exposure apparatus 6.

A target supply channel 2a for supplying the target 27 from the exterior of the chamber 2 to the interior of the chamber 2 may be provided on the side surface of the cylindrical chamber 2. The target supply channel 2a may be formed to be of a cylindrical shape. A target supply aperture 2b may be provided at the leading end of the target supply channel 2a. The direction of the central axis of the cylindrical target supply channel 2a may be substantially perpendicular to the direction in which the EUV light 252 is guided toward the exposure apparatus 6. The direction of the central axis of the cylindrical target supply channel 2a may be substantially perpendicular to a direction in which the pulsed laser beam 33 is irradiated from a laser beam focusing optical system 22a to be described later. If the chamber 2 is formed as a hollow sphere, the target supply channel 2a may be provided at a position on the wall surface of the chamber 2 other than those at which the window 21 and the connecting portion 29 are provided.

The laser beam focusing optical system 22a, an EUV focusing optical system 23a, a target collecting unit 28, a plate 225, a plate 235, and a manipulator 226 may be provided in the interior of the chamber 2.

The plate 235 may be fixed to the inner side surface of the chamber 2. An aperture 235a, through which the pulsed laser beam 33 can pass in the thickness direction thereof, may be provided in the center of the plate 235. The direction of the opening of the aperture 235a may be substantially the same direction of the axis that passes through the aperture 24 and the plasma generating region 25 in FIG. 1. The EUV focusing optical system 23a may be provided on a first surface of the plate 235. The plate 225 may be provided on a second surface of the plate 235 via the manipulator 226.

The EUV focusing optical system 23a provided on the first surface of the plate 235 may include an EUV focusing mirror 23 and a holder 231. The holder 231 may hold the EUV focusing mirror 23. The holder 231 that holds the EUV focusing mirror 23 may be fixed to the plate 235.

The position and the orientation of the plate 225 provided on the second surface of the plate 235 may be changed by the manipulator 226. The manipulator 226 may include an actuator configured to move the plate 225 in the three axial directions of the X direction, the Y direction, and the Z direction. The actuator for the manipulator 226 may be connected to the EUV light generation control unit 5 to be described later. The manipulator 226 may move the plate 225 based on control signals from the EUV light generation control unit 5. The position and orientation of the plate 225 may be changed according to the control signals from the EUV light generation control unit 5. The laser beam focusing optical system 22a may be provided on the plate 225.

The laser beam focusing optical system 22a may output the pulsed laser beam toward the plasma generating region 25 in a direction substantially parallel to the Z axis. The laser beam focusing optical system 22a may include a laser beam focusing mirror 22, a holder 223, and a holder 224. The laser beam focusing mirror 22 may include an off axis paraboloid mirror 221 and a planar mirror 222.

The holder 223 may hold the off axis paraboloid mirror 221. The holder 223 that holds the off axis paraboloid mirror 221 may be fixed to the plate 225. The holder 224 may hold the planar mirror 222. The holder 224 that holds the planar mirror 222 may be fixed to the plate 225.

The off axis paraboloid mirror 221 may be provided to face each of the window 21 provided at the bottom surface of the chamber 2 and the planar mirror 222. The planar mirror 222 may be provided to face each of the aperture 235a and the off axis paraboloid mirror 221. The positions and orientations of the off axis paraboloid mirror 221 and the planar mirror 222 may be adjusted accompanying changes to the position and orientation of the plate 225 by the EUV light generation control unit 5 via the manipulator 226. Such adjustments are executed such that the pulsed laser beam 33, which is a pulsed laser beam 32 that enters the off axis paraboloid mirror 221 and the planar mirror 222 and is reflected thereby, is focused in the plasma generating region 25.

The target collecting unit 28 may be provided along a line extending in a direction that the droplets 271, which are output into the chamber 2, travel.

The laser beam propagating direction control unit 34, the EUV light generation control unit 5, a target generator 7, and the droplet detector 41 may be provided at the exterior of the chamber 2.

The laser beam propagating direction control unit 34 may be provided between the window 21 provided in the bottom plate of the chamber 2 and the laser apparatus 3. The laser beam propagating direction control unit 34 may include a high reflectance mirror 341, a high reflectance mirror 342, a holder 343, and a holder 344.

The holder 343 may hold the high reflectance mirror 341. The holder 344 may hold the high reflectance mirror 342. The positions and orientations of the holder 343 and the holder 344 may be changed by actuators, which are not illustrated, connected to the EUV light generation control unit 5.

The high reflectance mirror 341 may be provided to face each of an emission outlet of the laser apparatus 3 that outputs a pulsed laser beam 31 and the high reflectance mirror 342. The high reflectance mirror 342 may be provided to face each of the window 21 of the chamber 2 and the high reflectance mirror 341. The positions and orientations of the high reflectance mirror 341 and the high reflectance mirror 342 may be adjusted accompanying changes to the positions and orientations of the holder 343 and the holder 344 by the EUV light generation control unit 5. Such adjustments are executed such that the pulsed laser beam 32, which is the pulsed laser beam 31 that enters the high reflectance mirror 341 and the high reflectance mirror 342 and is reflected thereby, is transmitted through the window 21 provided in the bottom plate of the chamber 2.

The target generator 7 may be provided at an end of the target supply channel 2a of the chamber 2. The target generator 7 may be equipped with the target supply unit 26, a temperature adjusting mechanism 71, a pressure adjusting mechanism 72, a droplet forming mechanism 73, and a stage 74.

The target supply unit 26 may include a tank 261 and a nozzle 262. The tank 261 may be formed as a hollow cylinder. The target 27 may be housed in the hollow tank 261. At least the interior of the tank 261 that houses the target 27 may be constituted by a material that is not likely to react with the target 27. The material that is not likely to react with the target 7 may be any one of: $SiC$, $SiO_2$, $Al_2O_3$, molybdenum, tungsten, and tantalum, for example.

The nozzle 262 may be provided on the bottom surface of the cylindrical tank 261. The nozzle 262 may be provided in the chamber 2 through the target supply aperture 2b of the chamber 2. The target supply aperture 2b may be sealed by the target supply unit 26 being installed. Thereby, the interior of the chamber 2 is isolated from the atmosphere. At least the inner surface of the nozzle 262 may be constituted by a material that is not likely to react with the target 27.

A first end of the pipe-shaped nozzle 262 may be fixed to the hollow tank 261. A nozzle aperture 262a may be provided at a second end of the pipe-shaped nozzle 262, as illustrated in FIG. 3. The tank 261 which is at the side of the first end of the nozzle 262 may be positioned outside the chamber 2, and the nozzle aperture 2a at the second end of the nozzle 262 may be positioned within the chamber 2. The plasma generating region 25 within the chamber 2 may be positioned along a line that extends in the direction of the central axis of the nozzle 262. The interiors of the tank 261, the nozzle 262, the target supply channel 2a, and the chamber 2 may be in communication with each other. The nozzle aperture 262a may be formed to be of a shape that ejects the target 27 into the chamber 2 in a molten state as a jet.

The temperature adjusting mechanism 71 may adjust the temperature of the tank 261. The temperature adjusting mechanism 71 may include a heater 711 and a heater power source 712, as illustrated in FIG. 3.

The heater 711 may be fixed to the outer side surface of the cylindrical tank 261. The heater 711 which is fixed to the tank 261 may heat the tank 261. The heater 711 that heats the tank 261 may be connected to the heater power source 712. The heater power source 712 may supply electrical power to the heater 711. The heater power source 712 that supplies electrical power to the heater 711 may be connected to the EUV light generation control unit 5. The heater power source 712 may be controlled by the EUV light generation control unit 5 to supply electrical power to the heater 711.

A temperature sensor, which is not illustrated, may be fixed to the outer side surface of the cylindrical tank 261. The temperature sensor which is fixed to the tank 261 may be connected to the EUV light generation control unit 5. The temperature sensor may detect the temperature of the tank 261, and output detection signals to the EUV light generation control unit 5. The EUV light generation control unit 5 may adjust the electrical power to be supplied to the heater 711, based on the detection signals which are output from the temperature sensor.

The temperature adjusting mechanism 71 is capable of adjusting the temperature of the tank 261 based on control signals from the EUV light generation control unit 5, by the configurations described above.

The pressure adjusting mechanism 72 may adjust the pressure within the tank 261. The pressure adjusting mechanism 72 may include a pressure adjustor 721, a pipe 722, and a gas tank 723, as illustrated in FIG. 3.

The pipe 722 may link the bottom surface portion of the cylindrical tank 261 opposite the nozzle 262 and the pressure adjustor 721. The pipe 722 enables the target supply unit 26 that includes the tank 261 and the pressure adjustor 721 to be in communication with each other. The pipe 722 may be covered by a heat shielding material, which is not illustrated. A heater, which is not illustrated, maybe provided on the pipe 722. The temperature within the pipe 722 may be maintained at approximately the same temperature as the temperature within the tank 261 of the target supply unit 26.

The gas tank 723 may be filled with an inert gas such as helium and argon. The gas tank 723 may supply the inert gas to the interior of the tank 261 via the pressure adjustor 721.

The pressure adjustor 721 may be provided at the bottom surface of the cylindrical tank 261 opposite the nozzle 262 via the pipe 722. The pressure adjustor 721 may include electromagnetic valves for supplying and exhausting gas, pressure sensors, etc. The pressure adjustor 721 may detect the pressure within the tank 261 employing the pressure sensor. The pressure adjustor 721 may be connected to the gas tank 723. The pressure adjustor 721 may supply the inert gas filled within the gas tank 723 to the interior of the tank 261. The pressure adjustor 721 may be connected to a gas exhausting pump, which is not illustrated. The pressure adjustor 721 may operate the gas exhausting pump to exhaust the gas from the interior of the tank 261. The pressure adjustor 721 may increase the pressure or decrease the pressure within the tank 261 by supplying gas into the tank 261 or by exhausting the gas within the tank 261.

The pressure adjustor 721 may be connected to the EUV light generation control unit 5. The pressure adjustor 721 may output detection signals that represent detected pressures to the EUV light generation control unit 5. Control signals which are output from the EUV light generation control unit 5 may be input to the pressure adjustor 721. The control signals which are output from the EUV light generation control unit 5 may control the operations of the pressure adjustor 721 such that the pressure within the tank 261 becomes a target pressure, based on the detection signals output thereto from the pressure adjustor 721. The pressure adjustor 721 may supply gas into the tank 261 or exhaust gas from the tank 261 based on the control signals from the EUV light generation control unit 5. Thereby, the pressure within the tank 261 can be adjusted to the target pressure.

The pressure adjusting mechanism 72 is capable of adjusting the pressure within the tank 261 with the pressure adjustor 721 based on the control signals from the EUV light generation control unit 5, by the configurations described above.

The droplet forming mechanism 73 may periodically separate the flow of the target 27 which is ejected from the nozzle 262 in the form of a jet, to form the droplets 271. The droplet forming mechanism 73 may form the droplets 271 by the continuous jet method, for example. In the continuous jet method, the nozzle 262 may be vibrated to impart standing wave in the flow of the target 27 which is ejected in the form of a jet, to periodically separate the target 27. The separated target 27 forms a free interface by its own surface tension, to form the droplets 271. The droplet forming mechanism 73 may include a piezoelectric element 731 and a piezoelectric power source 732, as illustrated in FIG. 3.

The piezoelectric element 731 may be fixed on the outer side surface of the pipe-shaped nozzle 262. The piezoelectric element 731 which is fixed on the nozzle 262 may impart vibrations to the nozzle 262. The piezoelectric element 731 that imparts vibrations to the nozzle 262 may be connected to the piezoelectric power source 732. The piezoelectric power source 732 may supply electrical power to the piezoelectric element 731. The piezoelectric power source 732 that supplies electrical power to the piezoelectric element 731 may be connected to the EUV light generation control unit 5. The piezoelectric power source 732 may be controlled by the EUV light generation control unit 5 to supply electrical power to the piezoelectric element 731.

The droplet forming mechanism 73 is capable of forming the droplets 271 based on control signals from the EUV light generation unit 5, by the configurations described above.

The droplet trajectory F may be the trajectory that the droplets 271, which are output from the nozzle aperture 262a, move along toward the plasma generating region 25. Note that the direction along which droplets 271 output from the nozzle aperture 262a move toward the plasma generating region 25 is also referred to as the "direction of travel of the droplets".

The stage 74 may move the target supply unit 26 in the directions of two axes in the X direction and the Z direction. The stage 74 may move the target supply unit 26 along a two dimensional plane, which is the XZ plane. The stage 74 may move the target supply unit 26 in a direction substantially perpendicular to the direction of the target trajectory F. The stage 74 may be connected to the EUV light generation control unit 5. Control signals which are output from the EUV light generation control unit 5 may be input to the stage 74. The control signals which are output from the EUV light generation control unit 5 may adjust the position of the target supply unit 26 such that the droplets 271 which are output into the chamber 2 reach a target position. The stage 74 may move the target supply unit 26 based on the control signals from the EUV light generation control unit 5. Thereby, the position in the X direction and the Z direction of the droplets 271 which are output into the chamber are adjusted such that the droplets 271 reach the target position.

The droplet detector 41 may detect the droplets 271 which are output into the chamber 2. The droplet detector 41 may be provided at a predetermined position on the side surface of the target supply channel 2a, as illustrated in FIG. 2. The droplet detector 41 may be positioned between the target supply unit 26 and the plasma generating region 25.

The droplet detector 41 may be equipped with a light source unit 411 and a light receiving unit 412, as illustrated in FIG. 3. The light source unit 411 and the light receiving unit 412 may be provided to face each other with the droplet trajectory F, which is the path along which the droplets 271 travel, interposed therebetween.

Note that in FIG. 2 and FIG. 3, the light source unit 411 and the light receiving unit 412 are illustrated such that the direction in which the light source unit 411 and the light receiving unit 412 face each other is a direction substantially perpendicular to the X direction for the sake of convenience. However, the illustrations of FIG. 2 and FIG. 3 do not limit the direction in which the light source unit 411 and the light receiving unit 412 face each other.

The light source unit 411 may output illuminating light, which is a continuous light beam, onto the droplets 271 that travel along the droplet trajectory F. The continuous light beam which is irradiated onto the droplets 271 may be a continuous laser beam. The light source unit 411 may include a light source 411a, an illuminating optical system 411b, and a window 411c.

The light source 411a may be a light source such as a CW (Continuous Wave) laser output device that outputs a continuous laser beam, for example. The beam diameter of the continuous light beam may be sufficiently greater than the diameter (20 μm, for example) of the droplets 271.

The illuminating optical system 411b may include optical elements such as lenses. The optical elements may include reflective optical elements such as mirrors, in addition to transmissive optical elements such as lenses. The illuminating optical system 411b may focus the continuous laser beam output by the light source 411a onto a droplet passage position P on the droplet trajectory F via the window 411c.

The light source unit 411 is capable of outputting the continuous laser beam toward the droplet passage position P on the droplet trajectory F by the configurations described above. When the droplets 271 that travel along the droplet trajectory F reach the droplet passage position P, the continuous laser beam output from the light source unit 411 illuminates the droplets 271.

The light receiving unit 412 may receive the continuous laser beam output from the light source unit 411, and may detect the intensity of the continuous laser beam. The light receiving unit 412 may include a photodetector 412a, a light receiving optical system 412b, and a window 412c.

The light receiving optical system 412b may be an optical system such as a collimator. The optical system such as a collimator may be constituted by optical elements such as lenses. The light receiving optical system 412b may guide the continuous laser beam output from the light source unit 411 to the photodetector 412a via the window 412c.

The photodetector 412a may be a light receiving element that includes photodiodes. The photodetector 412a may detect the intensity of the continuous laser beam guided thereto by the light receiving optical system 412b. The photodetector 412a may be connected to the EUV light generation control unit 5. The photodetector 412a may output detection signals that represent the detected intensities to the EUV light generation control unit 5.

The light receiving unit 412 is capable of detecting the intensity of the continuous laser beam output from the light source unit 411 and outputting the detected intensity to the EUV light generation control unit 5 by the configurations described above. When the droplets 271 reach the droplet passage position P along the droplet trajectory F, the intensity of the continuous laser beam at the light receiving unit 412 decreases because the continuous laser beam is shielded by the droplets 271. The light receiving unit 412 outputs signals corresponding to the changes in the intensity of light caused by the passage of the droplets 271 to the EUV light generation control unit 5. Note that the signals corresponding to the changes in the intensity of light caused by the passage of the droplets 271 will also be referred to as "passage timing signals".

The droplet detector 41 is capable of detecting the droplets 271 that travel from the target supply unit 26 toward the plasma generating region 25 and outputting the passage timing signals to the EUV light generation control unit 5 by the configurations described above. Thereby, the EUV light generation control unit 5 is capable of detecting the timings at which the droplets 271 that travel from the target supply unit 26 toward the plasma generating region 25 are detected. Particularly, the EUV light generation control unit 5 is capable of detecting the timings at which of the droplets 271 pass the droplet passage position P along the droplet trajectory F. Note that the timings at which the droplet detector 41 detects the droplets 271 will also be referred to as "detection timings". The detection timings may be timings when the passage timing signals have values less than a threshold value.

The EUV light generation control unit 5 may comprehensively control the operations of the target generator 7 and the droplet detector 41. The EUV light generation control unit 5 may control the operations of the temperature adjusting mechanism 71 that includes the heater power source 712, by outputting control signals to the heater power source 712. The EUV light generation control unit 5 may control the operations of the pressure adjusting mechanism 72 that includes the pressure adjustor 721, by outputting control signals to the pressure adjustor 721. The EUV light generation control unit 5 may control the operations of the droplet forming mechanism 73 that includes the piezoelectric power source 732, by outputting control signals to the piezoelectric power source 732. The EUV light generation control unit 5 may control the operations of the stage 74, by outputting control signals to the stage 74.

The EUV light generation control unit 5 may transmit and receive control signals to and from an exposure apparatus control unit 61, which is the control unit of the exposure apparatus 6. Thereby, the EUV light generation control unit 5 may comprehensively control the operations of the entirety of the EUV light generating system 11, based on commands from the exposure apparatus 6. The EUV light generation control unit 5 may control the stage 74 and the manipulator 226 based on commands from the exposure apparatus 6 related to a plasma generation command position. The EUV light generation control unit 5 may transmit and receive command signals to and from the laser apparatus 3. Thereby, the EUV light generation control unit 5 may control the operations of the laser apparatus 3. The EUV light generation control unit 5 may transmit and receive command signals to and from the actuators of each of the laser beam propagating direction control unit 34 and the laser beam focusing optical system 22a. Thereby, the EUV light generation control unit 5 may adjust the propagating directions of the pulsed laser beams 31 through 33 as well as the beam focusing position. The EUV light generation control unit 5 may transmit and receive command signals to and from the target generator 7 and the droplet detector 41. Thereby, the EUV light generation control unit 5 may control the operations of the target generator 7 and the droplet detector 41. Note that the hardware configuration of the EUV light generation control unit 5 will be described later with reference to FIG. 20.

The EUV light generation control unit 5 may generate droplet detection signals based on the passage timing signals which are output from the droplet detector 41. Note that the timings at which the EUV light generation control unit 5 generates the droplet detection signals will also be referred to as "generation timings". The EUV light generation control unit 5 may output trigger signals to the laser apparatus 3 at timings which are delayed by a delay time Tdl from the timings at which the droplet detection signals are generated. The trigger signals which are output from the EUV light generation control unit 5 may be signals that provide momentum for the laser apparatus 3 to perform laser oscillation and output the pulsed laser beam 31. The delay time Tdl may be delay times for synchronizing the timings at which the pulsed laser beam 33 is focused in the plasma generating region 25 and the timings at which the droplets 271 reach the plasma generating region 25. Thereby, when the droplets 271 which have passed the droplet passage position P along the droplet trajectory F reach the plasma generating region 25, the droplets can be irradiated by the pulsed laser beam 33. The EUV light generation control unit 5 may store the delay time Tdl which are input in advance. That is, the EUV light generation control unit 5 is capable of controlling the timings at which the pulsed laser beam 33 is irradiated, based on the generation timing and the delay time Tdl.

[4.2 Operation]

An outline of the operations of the EUV light generation control unit 5 of the EUV light generating apparatus 1 equipped with the droplet detector 41 will be described with reference to FIG. 4. FIG. 4 is a diagram for explaining the output timings of the laser apparatus 3, which is controlled by the EUV light generation control unit 5.

The EUV light generation control unit 5 may control the timings at which the laser apparatus 3 performs laser output. Passage timing signals output from the droplet detector 41 may be input to the EUV light generation control unit 5. The intensity of light of the passage timing signals which are input in cases that the droplets 271 pass through the droplet passage position P takes a lower value than the intensity of light of the passage timing signals which are input in case that the droplets 271 are not passing through the droplet passage position P, as described previously. The EUV light generation control unit 5 may determine that the droplets 271 are passing through the droplet passage position P in the case that the intensity of light of the input passage timing signals have values less than a threshold voltage Vs. In this case, the EUV light generation control unit 5 may generate droplet detection signals indicating that droplets 271 which have passed through the droplet passage position P have been detected. Note that the threshold voltage Vs may be a threshold value which is determined in advance based on a range of intensities of light of the passage timing signals in the case that the droplets 271 are passing through the droplet passage position P, and input. The droplet detection signals may be signals that represent that the droplet 271 which are passing through the droplet passage position P have been detected.

The EUV light generation control unit 5 may output trigger signals to the laser apparatus 3 at timings which are delayed by the delay time Tdl from the timings at which the droplet detection signals are generated. As described above, the trigger signals which are output from the EUV light generation control unit 5 may be signals that provide momentum for the laser apparatus 3 to perform laser oscillation and output the pulsed laser beam 31. The delay time Tdl may be delay times for synchronizing the timings at which the pulsed laser beam 33 is focused in the plasma generating region 25 and the timings at which the droplets 271 reach the plasma generating region 25.

The EUV light generation control unit 5 is capable of controlling the timings at which laser beams are output by the laser apparatus 3, by outputting the trigger signals to the laser apparatus 3 synchronized with the changes in the intensity of light of the input passage timing signals, employing the configurations described above. The EUV light generation control unit 5 is capable of controlling the timings at which laser beams are output by the laser apparatus 3 such that the pulsed laser beam 33 is focused in the plasma generating region at the timings at which the droplets 271 which have passed through the droplet passage position P reach the plasma generating region 25. Thereby, when the droplets 271 which are output into the chamber 2 reach the plasma generating region 25, the pulsed laser beam 33 can be irradiated onto the droplets 271. Note that the hardware configuration of the EUV light generation control unit 5 will be described later with reference to FIG. 20.

[5. Objective]

There are cases in which the droplet detector 41 is provided at an inclined orientation on the side surface of the target supply channel 2a (refer to FIG. 2), due to considerations with respect to the arrangements of other components of the EUV light generating apparatus 1. Specifically, there are cases in which the direction along which the light source unit 411 and the light receiving unit 412 of the droplet detector 41 face each other is inclined at a predetermined angle (denoted by θ in the drawings) with respect to a direction which is substantially perpendicular to the droplet trajectory F, as illustrated in FIG. 5A.

Here, the detecting optical axis illustrated in FIG. 5A refers to the axis of the optical path of the illuminating light beam which is detected by the light receiving unit 412 from within the illuminating light which is output from the light source unit 411. If the droplet detector 41 is provided at an inclination as illustrated in FIG. 5A, the detecting optical axis is set at a predetermined angle (denoted by θ in the drawings) with respect to the direction which is substantially perpendicular to the droplet trajectory F.

Here, the exposure apparatus control unit 61 is capable of outputting data related to a plasma generation command position (Xc, Yc, Zc). The target supply unit 26 is capable of moving based on the plasma generation command position (Xc, Yc, Zc) output from the exposure apparatus control unit 61. A case in which the target supply unit 26 moves in the Z direction will be considered in the following description. In this case, the distance between the nozzle aperture 262a of the target supply unit 26 and the detecting optical axis of the droplet detector 41 will change in the direction of the droplet trajectory F (the Y direction).

FIG. 5B is a diagram for explaining the relationship between a detecting optical axis of the droplet detector 41 and the trajectory of the droplets 271 prior to and following movement of the target supply unit 26 in the Z direction. FIG. 5B is a magnified view of the range Q illustrated in FIG. 5A. In FIG. 5B, a droplet trajectory O is the trajectory of the droplets 271 prior to the movement of the target supply unit 26 in the Z direction, and a droplet trajectory M is trajectory of the droplets 271 following the movement of the target supply unit 26 in the Z direction. In FIG. 5B, a passage point P1 of the droplets 271 is the intersection between the droplet trajectory O prior to the movement of the target supply unit 26 in the Z direction and the detecting optical axis. A passage point P2 of the droplets 271 is the intersection between the droplet trajectory M following the movement of the target supply unit 26 in the Z direction and the detecting optical axis.

Here, as illustrated in FIG. 5B, if the angle of inclination of the detecting optical axis with respect to the direction which is substantially perpendicular to the droplet trajectory O is designated as θ, and the distance that the target supply unit 26 moves in the Z direction is designated as ΔZ, the distance from the nozzle aperture 262a (refer to FIG. 3) to the passage point P2 will be longer than the distance from the nozzle aperture 262a to the passage point P1 by ΔZ·tan θ.

For this reason, the amount of time from the timing at which the droplets 271 are output from the nozzle aperture 262a to the timing at which the droplets 271 reach the passage point P2 along the droplet trajectory M will become longer than the amount of time from the timing at which the droplets 271 are output from the nozzle aperture 262a to the timing at which the droplets 271 reach the passage point P1 along the droplet trajectory O.

Further, if the velocity of the droplets 271 is designated as V, the timing that the droplets 271 reach the passage point P2 after being output will be later than the timing that the droplets 271 reach the passage point P1 after being output by ΔZ·tan θ/V.

For this reason, when the target supply unit 26 is moved in the Z direction based on a command from the exposure apparatus control unit 61, the timings at which the droplets 271 pass through the detecting optical axis may become shifted, even if the target supply unit 26 is not moved in the Y direction.

In this case, the timings at which the passage timing signals which are output from the droplet detector 41 to the EUV light generation control unit 5 change may be shifted. Accordingly, the timings at which the droplet detection signals are generated by the EUV light generation control unit 5 may be shifted. In addition, the timings at which the trigger signals are output from the EUV light generation control unit 5 to the laser apparatus 3 may be shifted. For this reason, the timings at which the pulsed laser beam 33 is irradiated onto the droplets 271 in the plasma generating region 25 may be shifted. If the timings at which the pulsed laser beam 33 is irradiated onto the droplets 271 in the plasma generating region 25 become shifted, the generation of the EUV light 251 may become unstable.

Due to the circumstances above, a technique that appropriately adjusts the timings at which the pulsed laser beam 33 is irradiated onto the droplets 271 in the plasma generating region 25, even in cases that the droplet detector 41 is provided at an inclined angle and the target supply unit 26 is moved, is desired.

[6. Droplet Detector and Calculation Control Unit Included in EUV Light Generating Apparatus According to First Embodiment]

[6.1 Configuration]

The configurations of a droplet detector 41 and a calculation control unit 51 of an EUV light generating apparatus 1 according to a first embodiment will be described with reference to FIG. 6. The configuration of a target generator 7 of the first embodiment may be the same as the configuration of the target generator 7 illustrated in FIG. 2 and FIG. 3. With respect to the configuration of the droplet detector 41 of the first embodiment, descriptions will be omitted for components which are the same as those of the EUV light generating apparatus 1 illustrated in FIG. 2 and FIG. 3.

Figure 6:
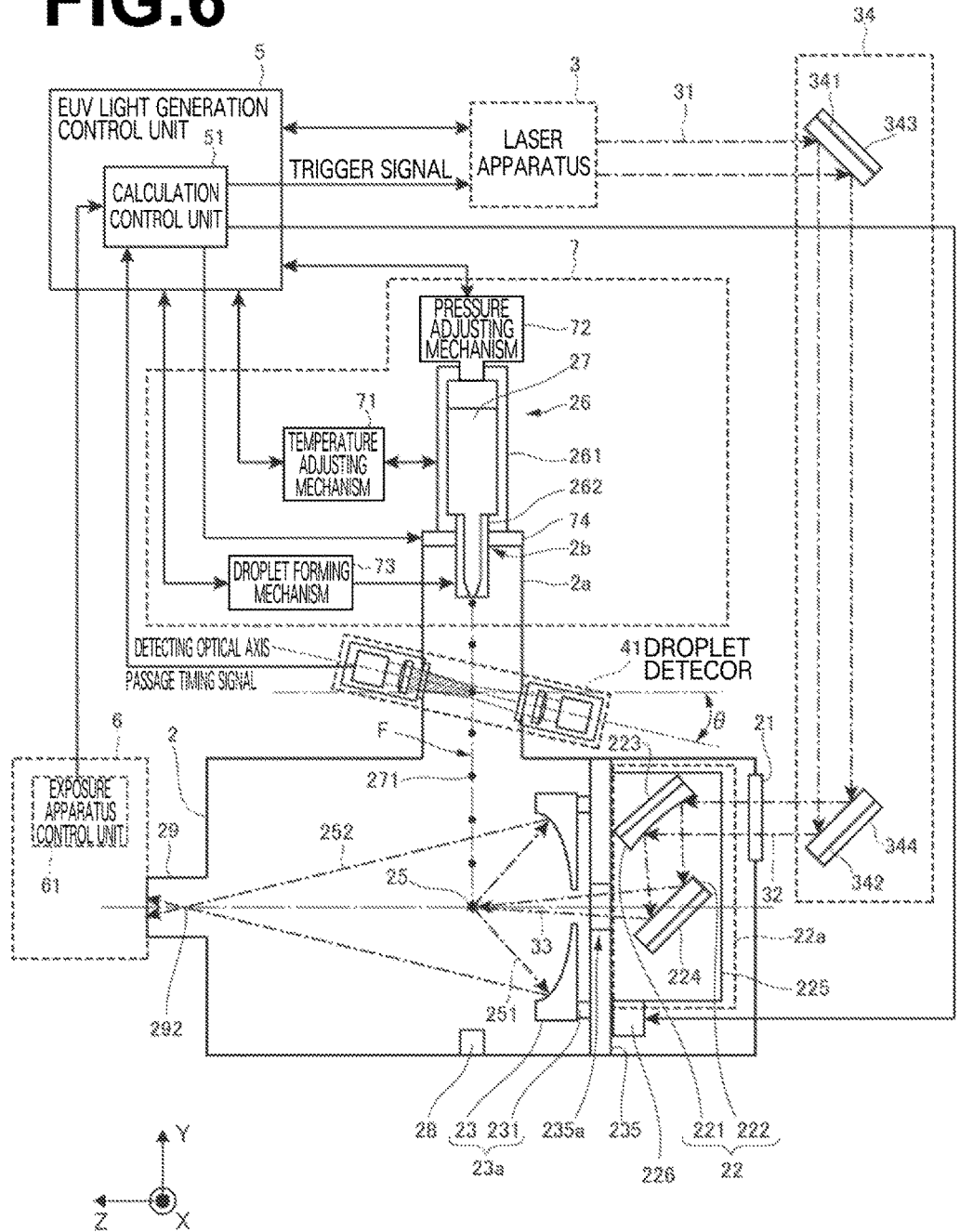
FIG. 6 is a diagram for explaining the configuration of an EUV light generating apparatus according to a first embodiment.

The detecting optical axis of the droplet detector 41 may be inclined at a predetermined angle (denoted by θ in the drawing) with respect to a direction which is substantially perpendicular to a droplet trajectory F, as illustrated in FIG. 6. In addition, the detecting optical axis may be inclined with respect to the XZ plane, in which the target supply unit 26 is moved by the stage 74. The droplet detector 41 may be provided at an inclination with respect to the XZ plane, as illustrated in FIG. 6.

The calculation control unit 51 may receive data regarding a plasma generation command position (Xc, Yc, Zc) output from the exposure apparatus control unit 61 by the configurations illustrated in FIG. 6. The calculation control unit 51 may output the data regarding the plasma command position (Xc, Yc, Zc) to the stage 74. The calculation control unit 51 may output the data regarding the plasma command position (Xc, Yc, Zc) to the manipulator 226. The calculation control unit 51 may receive the passage timing signals which are output from the droplet detector 41. The calculation control unit 51 may output trigger signals that provide momentum for laser oscillation to be performed and for the laser beam 31 to be output to the laser apparatus 3.

Note that the other components of the EUV light generating apparatus 1 of the first embodiment may be the same as those of the EUV light generating apparatus 1 illustrated in FIG. 2.

[6.2 Operation]

An outline of the operations of the calculation control unit 51 of the EUV light generating apparatus 1 equipped with the droplet detector 41 illustrated in FIG. 6 will be described with reference to FIG. 7 through FIG. 11. With respect to the operations of the EUV light generating apparatus 1 equipped with the droplet detector 41, descriptions of operations which are the same as those of the EUV light generating apparatus 1 illustrated in FIG. 2 and FIG. 3 will be omitted.

Figure 7:
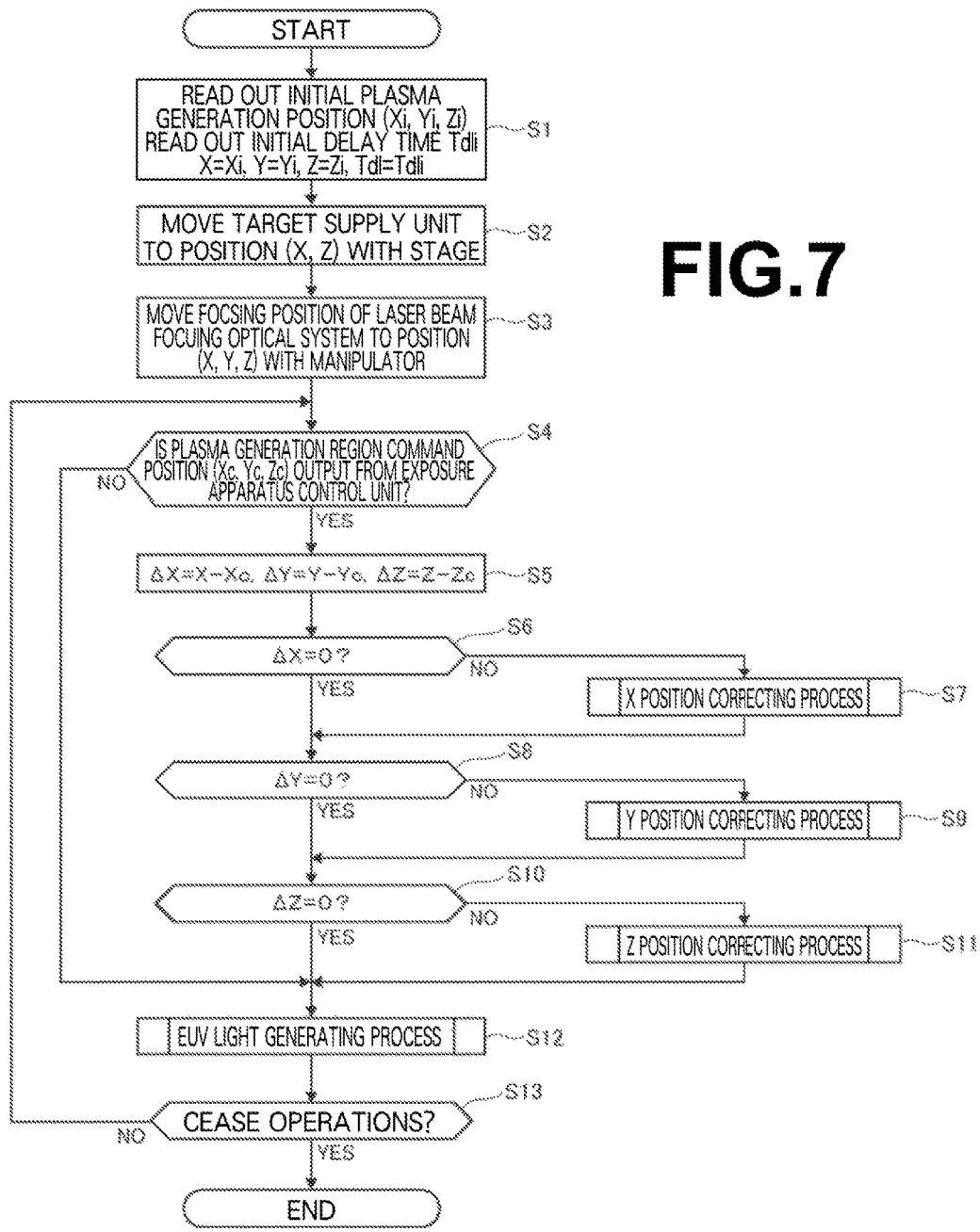
FIG. 7 is a flow chart for explaining operations which are performed by a calculation control unit illustrated in FIG. 6.

First, an outline of the operations of the EUV light generating apparatus 1 that includes the calculation control unit 51 of the first embodiment will be described with reference to FIG. 7.

At step S1, the calculation control unit 51 may read out an initial plasma generation position (Xi, Yi, Zi) and an initial delay time Tdli as initial setting data for the plasma generating region 25 from a memory, which is not illustrated. The initial plasma generation position (Xi, Yi, Zi) and the initial delay time Tdli may alternatively be input by an operator. The calculation control unit 51 may set the initial delay time Tdli as the delay time Tdl.

At step S2, the calculation control unit 51 may move the target supply unit 26 such that the droplet trajectory F (refer to FIG. 2) passes through the initial plasma generation position (Xi, Yi, Zi) at which EUV light is generated. The calculation control unit 51 may move the target supply unit 26 by controlling the stage 74.

At step S3, the calculation control unit 51 may move the laser beam focusing position of the laser beam focusing optical system 22a to the initial plasma generation position (Xi, Vi, Zi). The laser beam focusing position of the laser beam focusing optical system 22a may be moved by controlling the manipulator 226.

At step S4, the calculation control unit 51 may determine whether a plasma generation command position (Xc, Yc, Zi) at which EUV light is generated has been output from the exposure apparatus control unit 61. If the calculation control unit 51 determines that data regarding a plasma generation command position (Xc, Yc, Zi) has been output from the exposure apparatus control unit 61, the operation may proceed to step S5. If the calculation control unit 51 determines that data regarding a plasma generation command position (Xc, Yc, Zi) has not been output from the exposure apparatus control unit 61, the operation may proceed to step S12.

At step S5, the calculation control unit 51 may calculate difference values Δ between the initial plasma generation position (Xi, Yi, Zi) and the plasma generation command position (Xc, Yc, Zc) for each coordinate.

At step S6, the calculation control unit 51 may determine whether a difference value (ΔX) between the initial plasma generation position (Xi, Yi, Zi) and the plasma generation command position (Xc, Yc, Zc) in the X direction is 0. In the case that the calculation control unit 51 determines that the difference value (ΔX) is not 0, the operation may proceed to step S7. On the other hand, in the case that the calculation control unit 51 determines that the difference value (ΔX) is 0, the operation may proceed to step S8.

At step S7, the calculation control unit 51 may perform an X position correcting process. Details of the X position correcting process will be described later with reference to FIG. 8.

At step S8, the calculation control unit 51 may determine whether a difference value (ΔY) between the initial plasma generation position (Xi, Yi, Zi) and the plasma generation command position (Xc, Yc, Zc) in the Y direction is 0. In the case that the calculation control unit 51 determines that the difference value (ΔY) is not 0, the operation may proceed to step S9. On the other hand, in the case that the calculation control unit 51 determines that the difference value (ΔY) is 0, the operation may proceed to step S10.

At step S9, the calculation control unit 51 may perform a Y position correcting process. Details of the Y position correcting process will be described later with reference to FIG. 9.

At step S10, the calculation control unit 51 may determine whether a difference value (ΔZ) between the initial plasma generation position (Xi, Yi, Zi) and the plasma generation command position (Xc, Yc, Zc) in the Z direction is 0. In the case that the calculation control unit 51 determines that the difference value (ΔZ) is not 0, the operation may proceed to step S11. On the other hand, in the case that the calculation control unit 51 determines that the difference value (ΔZ) is 0, the operation may proceed to step S12.

At step S11, the calculation control unit 51 may perform a Z position correcting process. Details of the Z position correcting process will be described later with reference to FIG. 10.

At step S12, the calculation control unit 51 may execute an EUV light generating process. Details of the EUV light generating process will be described later with reference to FIG. 11.

At step S13, the calculation control unit 51 determines whether generation of EUV light is to be ceased. In the case that a control signal commanding that the generation of EUV light is to be ceased is output from the exposure apparatus control unit 61, the calculation control unit 51 determines that the generation of EUV light is to be ceased, and the processes of the present flow chart may be completed. In the case that the calculation control unit 51 determines that the generation of EUV is not to be ceased, the operations may return to step S4 described above, An outline of the X position correcting process performed by the calculation control unit 51 in the EUV light generating apparatus 1 equipped with the droplet detector 41 will be described with reference to FIG. 8. The X position correcting process may be step S7 in FIG. 7.

At step S71, the calculation control unit 51 may add the difference value (ΔX) to a plasma generation position (X), which is set to be the initial plasma generation position (Xi) based on data regarding the difference value (ΔX), which is calculated at step S5, as shown below.

$$X=X+\Delta X$$

At step S72, the calculation control unit 51 may control the stage 74 based on the coordinate (X) which is set at step S71, to move the target supply unit 26.

At step S73, the calculation control unit 51 may move the laser beam focusing position of the laser beam focusing optical system 22a, by controlling the manipulator 226 based on the coordinate (X) which is set at step S71.

Figure 8:
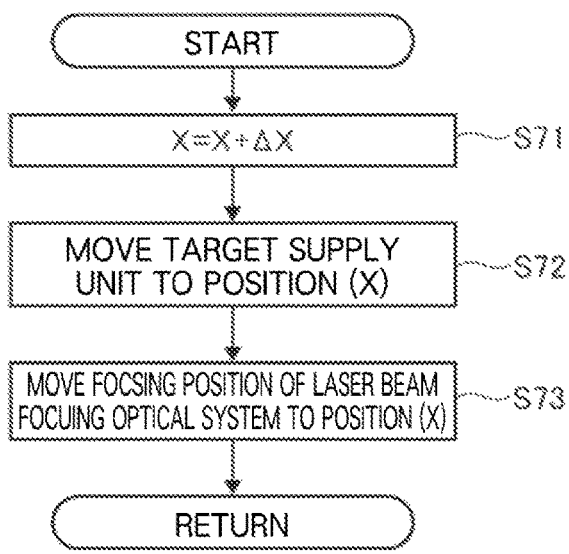
FIG. 8 is a flow chart for explaining an X position correcting process performed by the calculation control unit illustrated in FIG. 7.

Here, the direction of the coordinate (X) may be a direction which is substantially parallel to the two dimensional plane (the XZ plane) in which the target supply unit 26 is capable of moving, and perpendicular to the detecting optical axis. Note that the direction of the coordinate (X) will also be referred to as a "predetermined direction". In the case that the direction of movement of the target supply unit 26 and the laser beam focusing optical system 22a is the direction of the coordinate (X) as illustrated in FIG. 8, it is not necessary for the calculation control unit 51 to update the delay time Tdl.

An outline of the Y position correcting process performed by the calculation control unit 51 in the EUV light generating apparatus 1 equipped with the droplet detector 41 will be described with reference to FIG. 9. The Y position correcting process may be step S9 in FIG. 7.

At step S91, the calculation control unit 51 may add the difference value (ΔY) to a plasma generation position (Y), which is set to be the initial plasma generation position (Yi) based on data regarding the difference value (ΔY), which is calculated at step S5, as shown below.

$$Y=Y+\Delta Y$$

At step S92, the calculation control unit 51 may move the laser beam focusing position of the laser beam focusing optical system 22a, by controlling the manipulator 226 based on the coordinate (Y) which is set at step S91.

At step S93, the calculation control unit 51 may perform adjustments such that the timings at which the pulsed laser beam 33 is focused in the plasma generating region 25 are synchronized with the timings at which the droplets 271 reach the plasma generating region 25, of which the coordinate (Y) has been changed.

The calculation control unit 51 may calculate the amount of time (ΔT) that the droplets 271 travel through the difference value (ΔY) between the initial plasma generation position (Yi) and the plasma generation command position (Yc), based on data regarding the difference value (ΔY) which is calculated at step S5 and data regarding the velocity (V) of the droplets 271, as shown below.

$$\Delta T=\Delta Y/V$$

The calculation control unit 51 may read out the data regarding the velocity (V) of the droplets 271 from a memory which is not illustrated. Data regarding the velocity (V) of the droplets 271 may be input to the memory in advance by an operator.

At step S94, the calculation control unit 51 may update the delay time Tdl by adding the amount of time (ΔT) to the delay time Tdl, which is set to the initial delay time Tdli, based on the amount of time (ΔT) that the droplets 271 travel through the difference value (ΔY), which is calculated at step S93, as shown below.

$$Tdl=Tdl+\Delta T$$

Note that the delay time Tdl which is updated at step S94 will also be referred to as a "first delay time".

Figure 9:
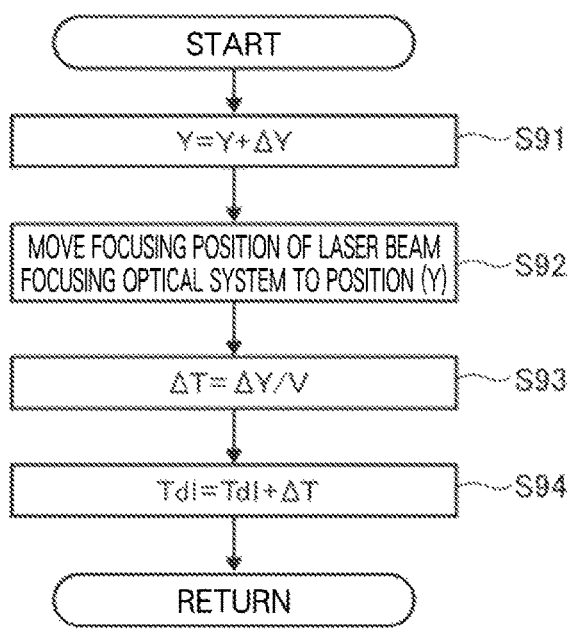
FIG. 9 is a flow chart for explaining a Y position correcting process performed by the calculation control unit illustrated in FIG. 7.

The calculation control unit 51 may update the delay time Tdl in the case that the direction of movement of the target supply unit 26 and the laser beam focusing optical system 22a is the direction of the coordinate (Y) as illustrated in FIG. 9. That is, the calculation control unit 51 may update the delay time Tdl in the case that the direction of movement of the target supply unit 26 and the laser beam focusing optical system 22a is not the direction of the coordinate (X), which is the predetermined direction.

Figure 10:
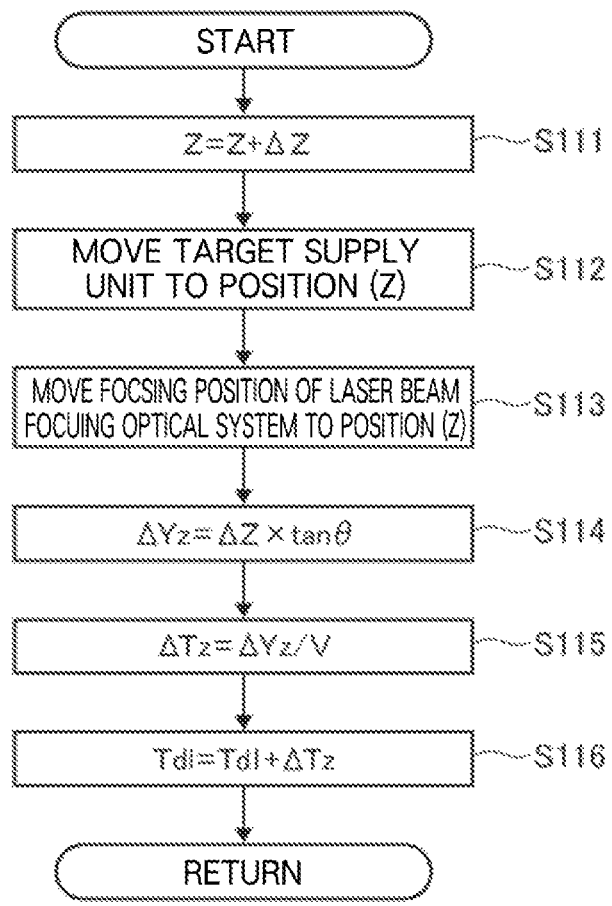
FIG. 10 is a flow chart for explaining a Z position correcting process performed by the calculation control unit illustrated in FIG. 7.

An outline of the Z position correcting process performed by the calculation control unit 51 in the EUV light generating apparatus 1 equipped with the droplet detector 41 will be described with reference to FIG. 10. The Z position correcting process may be step S11 in FIG. 7.

At step S111, the calculation control unit 51 may add the difference value (ΔZ) to a plasma generation position (Z), which is set to be the initial plasma generation position (Zi) based on data regarding the difference value (ΔZ), which is calculated at step S5, as shown below.

$$Z=Z+\Delta Z$$

At step S112, the calculation control unit 51 may control the stage 74 based on the coordinate (Z) which is set at step S111, to move the target supply unit 26.

At step S113, the calculation control unit 51 may move the laser beam focusing position of the laser beam focusing optical system 22a, by controlling the manipulator 226 based on the coordinate (Z) which is set at step S111.

At step S114, the calculation control unit 51 may calculate the distance (ΔYz) in the Y direction between a passage point P1 and a passage point P2, based on data regarding the inclination angle θ of the detecting optical axis with respect to the direction which is substantially perpendicular to the droplet trajectory O illustrated in FIG. 5B and a predetermined distance ΔZ, which is the distance of movement of the target supply unit 26 in the Z direction, as shown below.

$$\Delta Yz=\Delta Z\cdot\tan\theta$$

The calculation control unit 51 may read out the data regarding the inclination angle (θ) of the detecting optical axis of the droplet detector 41 from a memory, which is not illustrated. The data regarding the inclination angle (θ) may be input to the memory in advance by an operator.

At step S115, the calculation control unit 51 may calculate a temporal difference (ΔTz) between the amount of time from when the droplets 271 are output from the nozzle aperture 262a until they reach the passage point P1 and the amount of time from when the droplets 271 are output from the nozzle aperture 262a until they reach the passage point P2, based on the data regarding the distance (ΔYz) calculated at step S114 and data regarding the velocity (V) of the droplets 271, as shown below.

$$\Delta Tz=\Delta Yz/V$$

The calculation control unit 51 may read out the data regarding the velocity (V) of the droplets 271 from a memory, which is not illustrated.

At step S116, the calculation control unit 51 may update the delay time Tdl by adding the temporal difference (ΔTx) to the delay time Tdl based on the temporal difference ΔTz which is calculated at step S115 as shown below.

$$Tdl=Tdl+\Delta Tz$$

The delay time Tdl to which the temporal difference (ΔZ·tan θ/V) is added may be updated by further adding the temporal difference ΔTz thereto, in the case that the travel time ΔT is added accompanying movement of the target supply unit 26 in the Y direction at step S94 of FIG. 9. Note that the temporal difference (ΔZ·tan θ/V) which is added at step S116 will also be referred to as a "second delay time".

The calculation control unit 51 may update the delay time Tdl in the case that the direction of movement of the target supply unit 26 and the laser beam focusing optical system 22a is the direction of the coordinate (Z), and not the direction of the coordinate (X), which is the predetermined direction.

Here, the direction of the coordinate (Z) in which the target supply unit 26 and the laser beam focusing optical system 22a are moved may be different from a direction within a plane (the XY plane) that includes the direction of the coordinate (X), which is the predetermined direction, and the direction of the droplet trajectory D. That is, the calculation control unit 51 may update the delay time Tdl in the Z position correcting process accompanying movement in a direction other than directions within the plane (the XY plane) that includes the predetermined direction and the direction of the droplet trajectory D. In addition, the calculation control unit 51 may further update the delay time Tdl in the case that the travel time (ΔT) is added accompanying movement of the target supply unit 26 in the Y direction in step S94 of FIG. 9.

Figure 11:
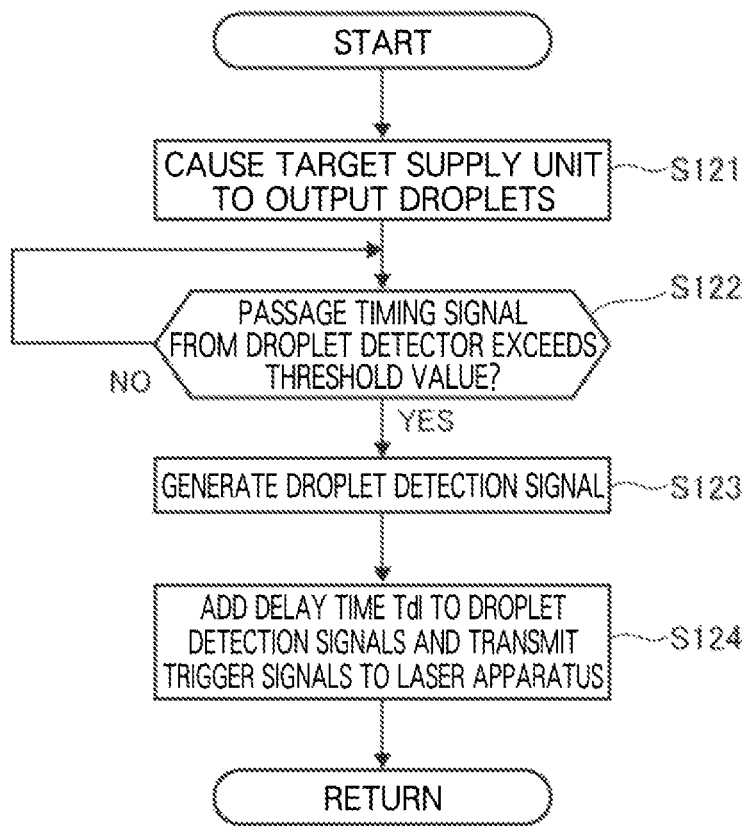
FIG. 11 is a flow chart for explaining an EUV light generating process performed by the calculation control unit illustrated in FIG. 7.

An outline of the EUV light generating process performed by the EUV light generation control unit 5 and the calculation control unit 51 of the EUV light generating apparatus 1 equipped with the droplet detector 41 illustrated in FIG. 6 will be described with reference to FIG. 11. The EUV light generating process may be step S12 of FIG. 7.

At step S121, the EUV light generation control unit 5 may control the target supply unit 26 to output the droplets 271 into the chamber 2. Note that the period at which the droplets 271 are output form the target supply unit 26 into the chamber 2 will also be referred to as a "generation period" of the droplets 271.

At step S122, the calculation control unit 51 may determine whether the passage timing signals which are input from the droplet detector 41 have exceeded a threshold value. The calculation control unit 51 may proceed to step S123 in the case that it is determined that the passage timing signals have exceeded the threshold value. On the other hand, the process may return to step S122 in the case that it is determined that the passage timing signals have not exceeded the threshold value.

At step S123, the calculation control unit 51 may generate the droplet detection signals based on the passage timing signals which are input form the droplet detector 41.

At step S124, the calculation control unit 51 may output trigger signals to the laser apparatus 3 at timings which are delayed from the generated droplet detection signals by the delay time Tdl. Thereafter, the laser apparatus 3 may perform laser oscillation and output the pulsed laser beam 31.

The pulsed laser beam 31 which is output from the laser apparatus may be introduced into the chamber 2 via the laser beam propagating direction control unit 34 as the pulsed laser beam 32. The pulsed laser beam 32 which is introduced into the chamber 2 may be focused by the laser beam focusing optical system 22a, and enter the plasma generating region 25 as the pulsed laser beam 33.

Note that the other operations of the EUV light generating apparatus 1 of the first embodiment may be the same as the operations of the EUV light generating apparatus 1 illustrated in FIG. 2.

[6.3 Effect]

The EUV light generating apparatus 1 of the first embodiment is capable of irradiating the pulsed laser beam 33 onto the droplets 271 at optimal timings, even in cases the target supply unit 26 is moved in a state in which the detecting optical axis of the droplet detector 41 is provided at an inclined angle. The EUV light generating apparatus 1 is capable of substantially matching the position of plasma light which is actually generated within the plasma generating region 25 with the plasma generation command position which is determined by a command from the exposure apparatus control unit 61. Therefore, the EUV light generating apparatus 1 of the first embodiment is capable of stably guiding appropriately generated EUV light 252 to the exposure apparatus 6.

[7. Droplet Detector and Calculation Control Unit Included in EUV Light Generating Apparatus According to Second Embodiment]

[7.1 Configuration]

The configuration of a droplet detector 42 included in an EUV light generating apparatus 1 according to a second embodiment will be described with reference to FIG. 12 and FIG. 13. The droplet detector 42 of the second embodiment may be a different embodiment of the droplet detector 41 of the first embodiment. With respect to the configuration of the droplet detector 42 of the second embodiment, descriptions of components which are the same as those of the droplet detector 41 illustrated in FIG. 2, FIG. 3, FIG. 5A, and FIG. 6 will be omitted.

A light source unit 421 and a light receiving unit 422 of the droplet detector 42 may be provided at one side (toward the Z direction) of the droplet trajectory F within a YZ plane. The light source unit 421 and the light receiving unit 422 of the droplet detector 42 according to the second embodiment may be provided at one side of the droplet trajectory F, not provided at positions having the droplet trajectory F interposed therebetween.

Figure 12:
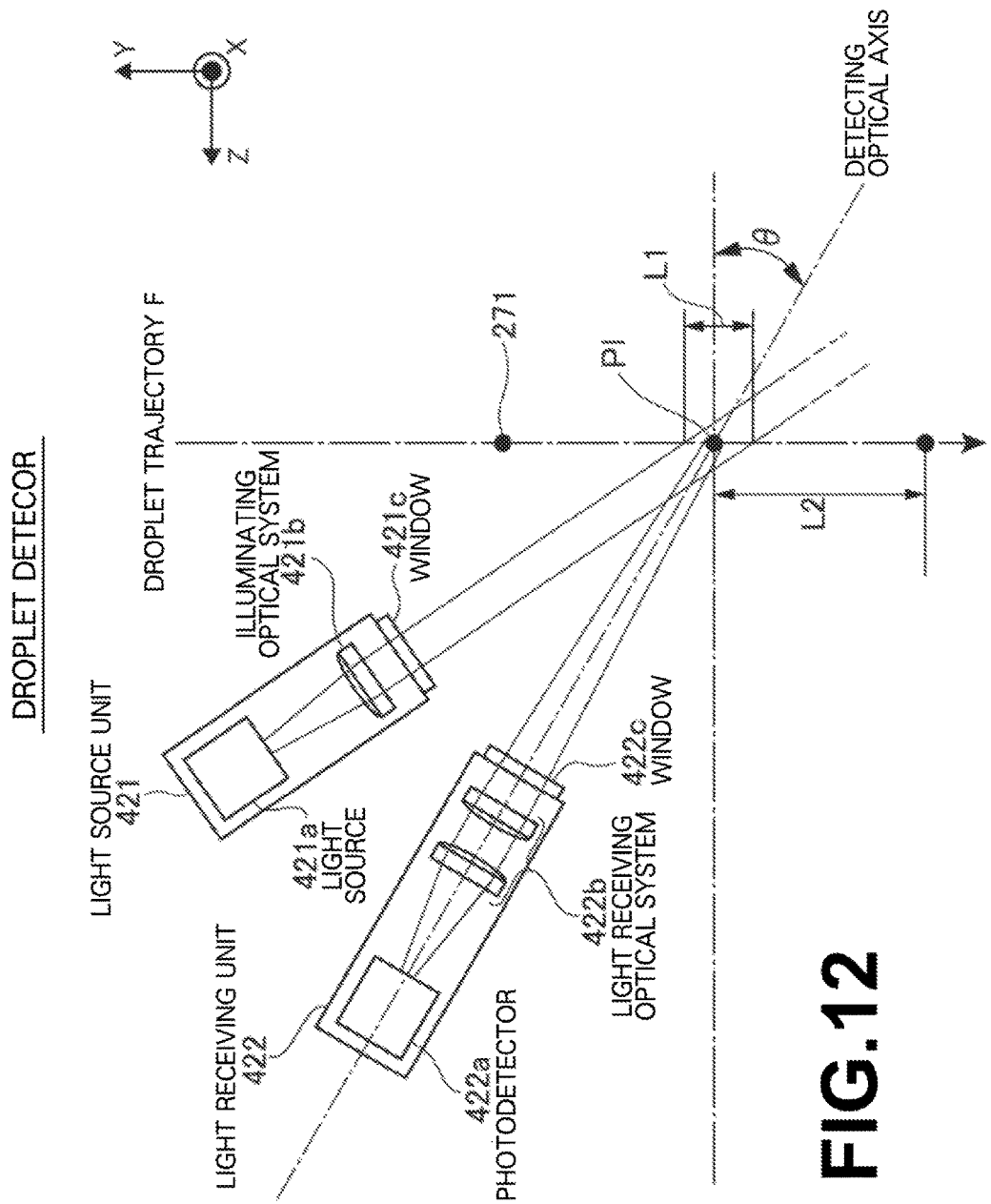
FIG. 12 is a diagram for explaining the configuration of an EUV light generating apparatus according to a second embodiment.

The light source unit 421 may guide illuminating light from a light source 421a to a passage position PI along the droplet trajectory F of the droplets 271 and the vicinity thereof by an illuminating optical system 421b such as a collimator, as illustrated in FIG. 12. The droplets 271 may travel along the droplet trajectory F, reflect the illuminating light from the light source unit 421, and emit reflected light. The light receiving unit 422 may receive the reflected light emitted by the droplets 271.

The length in the Y direction (denoted as L1 in the drawing) of an irradiation range of the illuminating light guided to the droplet trajectory F may be shorter than the intervals (denoted as L2 in the drawing) among adjacent droplets 271.

In addition, a slit plate, which is not illustrated, may be provided in a light receiving unit 422 between a photodetector 422a and a light receiving optical system 422b. The slit plate may restrict the incident range of reflected light to the photodetector 422a, such that only reflected light from individual droplets 271 on the droplet trajectory F is detected.

The detecting optical axis illustrated in FIG. 12 refers to the axis of the optical path of the reflected light which is detected by the light receiving unit 422 from within the reflected light which is emitted by the droplets 271 by receiving illuminating light output from the light source unit 421. The detecting optical axis may be set to be inclined at a predetermined angle (denoted by θ in the drawings) with respect to a direction which is substantially perpendicular to the droplet trajectory F if the light receiving unit 422 is provided at an inclination as illustrated in FIG. 12.

Note that with respect to the other components of the droplet detector 42 of the second embodiment, they may be the same as the components of the droplet detector 41 illustrated in FIG. 2, FIG. 3, FIG. 5A, and FIG. 6.

[7.2 Operation]

The operations of the calculation control unit 51 of the EUV light generating apparatus 1 equipped with the droplet detector 42 of the second embodiment will be described with reference to FIG. 13. FIG. 13 is a time chart that illustrates timings up to a point when a trigger signal is output by the calculation control unit 51 of the EUV light generating apparatus 1 equipped with the droplet detector 42 of the second embodiment. Descriptions of the operations of the calculation control unit 51 illustrated in FIG. 13 which are the same as those of the EUV light generation control unit 5 illustrated in FIG. 4 will be omitted.

The droplets 271 may be output into the chamber 2 at predetermined generation periods, and pass through the passage position PI along the droplet trajectory F. At this time, the calculation control unit 51 may control the output timings of trigger signals to be output to the laser apparatus 3 based on passage timing signals output from the droplet detector 42 in the following manner.

The light source unit 421 of the droplet detector 42 may emit a continuous light beam toward the passage position PI of the droplets 271 along the droplet trajectory F and the vicinity thereof. The light receiving unit 422 may receive reflected light emitted by the droplets 271 which have reached the passage position PI. The amount of light received by the light receiving unit 422 increases at timings which are synchronized with the timings at which the droplets 271 pass through the passage position PI along the droplet trajectory F. The droplet detector 42 may output the passage timing signals to the calculation control unit 51 as they are.

Figure 13:
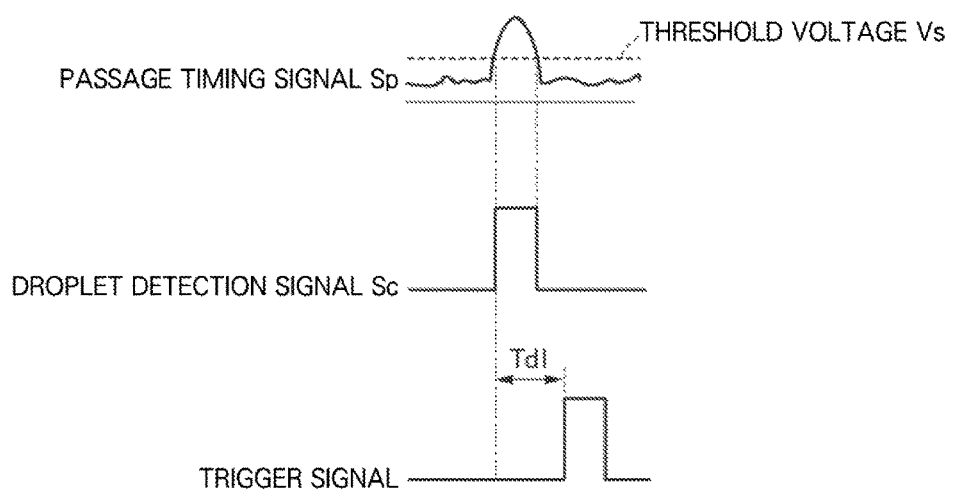
FIG. 13 is a time chart that illustrates timings up to a point when a trigger signal is output by a calculation control unit of the second embodiment.

The calculation control unit 51 may have a threshold voltage Vs set with respect to the input passage timing signals Sp, as illustrated in the upper portion of FIG. 13. The calculation control unit 51 may generate droplet detection signals Sc at timings when the passage timing signals Sp exceed the threshold voltage Vs, as illustrated in the middle portion of FIG. 13.

When the droplet detection signals Sc are generated, the calculation control unit 51 may generate trigger signals to be output to the laser apparatus 3 delayed by the delay time Tdl from timings at which the droplet detection signals are generated, as illustrated in the lower portion of FIG. 13. The calculation control unit 51 may output the trigger signals to the laser apparatus 3 when the trigger signals are generated. When the trigger signals are input, the laser apparatus 3 irradiates the plasma generating region 25 with the pulsed laser beam 33.

Note that the other operations of the droplet detector 42 of the second embodiment may be the same as those of the droplet detector 41 illustrated in FIG. 4. In addition, the other operations of the calculation control unit 51 of the EUV light generating apparatus 1 equipped with the droplet detector 42 of the second embodiment may be the same as those of the calculation control unit 51 of the EUV light generating apparatus 1 equipped with the droplet detector 41 illustrated in FIG. 6.

[7.3 Effect]

The EUV light generating apparatus 1 of the second embodiment is capable of generating passage timing signals Sp and droplet detection signals Sc at appropriate timings, even if the detecting optical axis of the light receiving unit 422 of the droplet detector 42 is inclined with respect to the droplet trajectory F. Therefore, the pulsed laser beam 33 can be irradiated onto the droplets 271 at optimal timings, even in cases that the target supply unit 26 moves.

In addition, the light source unit 421 and the light receiving unit 422 may be provided at one side of the droplet trajectory F. Therefore, it becomes possible to miniaturize the droplet detector 42.

[8. Droplet Detector and Calculation Control Unit Included in EUV Light Generating Apparatus According to Third Embodiment]

[8.1 Configuration]

The configuration of a droplet detector 43 included in an EUV light generating apparatus 1 according to a third embodiment will be described with reference to FIG. 14A through FIG. 14C. The droplet detector 43 of the third embodiment may be a different embodiment of the droplet detector 41 of the first embodiment and the droplet detector 42 of the second embodiment. With respect to the configuration of the droplet detector 43 of the third embodiment, descriptions of components which are the same as those of the droplet detectors illustrated in FIG. 2, FIG. 3, FIG. 5A, FIG. 6, and FIG. 12 will be omitted.

Figure 14A:
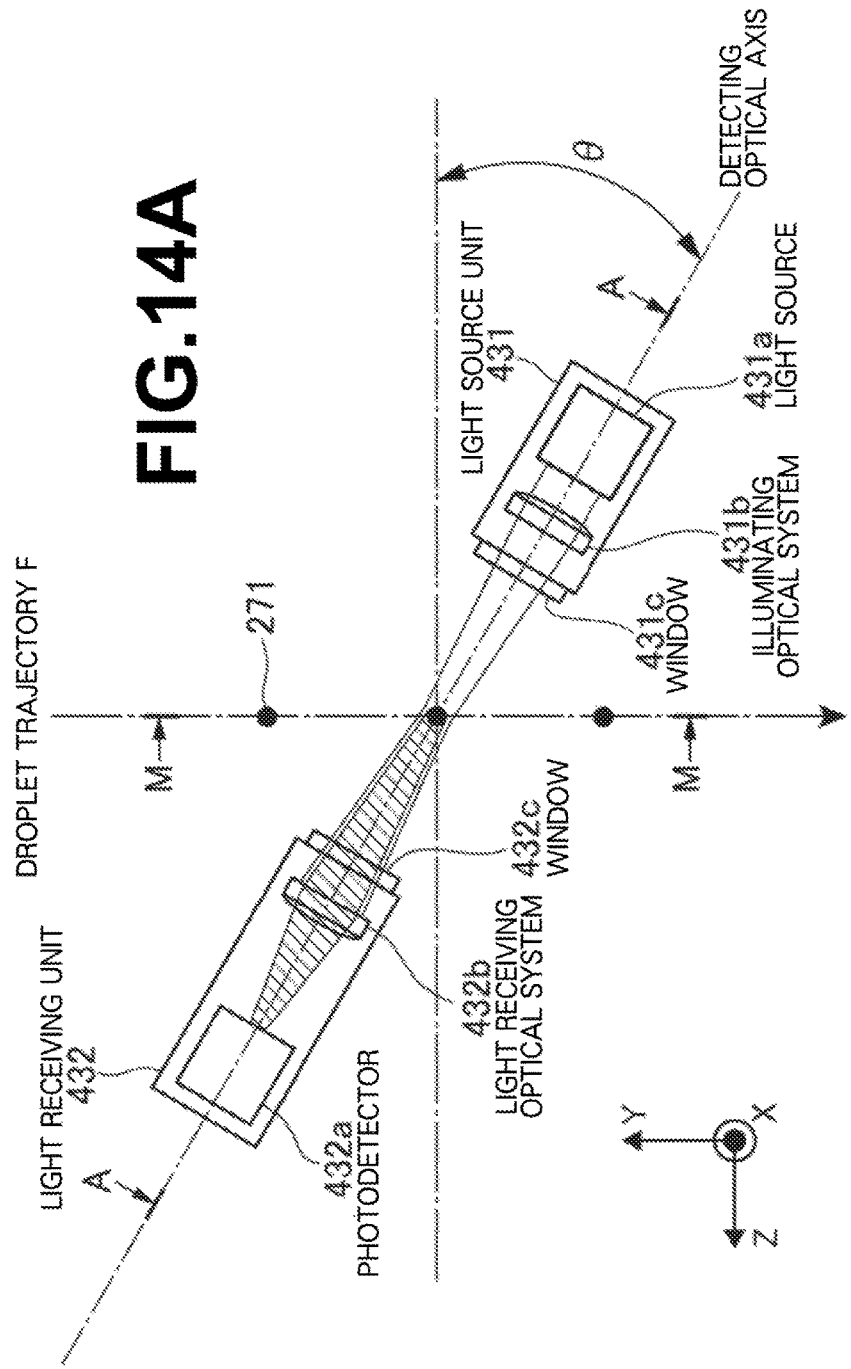
FIG. 14A is a magnified view of a droplet detector according to a third embodiment.

The detecting optical axis illustrated in FIG. 14A refers to the axis of the optical path of illuminating light which is detected by a light receiving unit 432 from within illuminating light output from a light source unit 431. The detecting optical axis may be set to be inclined at a predetermined angle (denoted by θ in the drawings) with respect to a direction which is substantially perpendicular to the droplet trajectory F if the droplet detector 43 is provided at an inclination as illustrated in FIG. 14A.

An illuminating optical system 431b may be a planoconvex cylindrical lens having a planar surface and a convex surface. The central axis of the convex surface of the planoconvex cylindrical lens may be provided to be substantially perpendicular to the detecting optical axis and the droplet trajectory F.

FIG. 14B is a cross sectional view of the droplet detector 43 of FIG. 14A taken along the line A-A as viewed from the upstream side of the direction of travel of the droplets 271.

A presumed trajectory range Pa may be a range which is determined based on a possible range of plasma generation command positions (Xc) that may be output from the exposure apparatus control unit 61. The presumed trajectory range Pa may be a region included in a droplet detecting region K illustrated in FIG. 14B. Here, the droplet detecting region K may be set according to the configuration of the droplet detector 43 a maximum range within which the droplets 271 can be detected by the droplet detector 43. Accordingly, the droplet detector 43 may be configured to be capable of detecting all of the droplets 271 that reach the possible range of plasma generation command positions (Xc).

Illuminating light which is output from the light source unit 431 may be temporarily focused within the droplet detecting region K by the illuminating optical system 431b, and may enter the light receiving unit 432 while being diffused.

A light source 431a may output illuminating light having a beam with a circular cross section toward the illuminating optical system 431b. The illuminating optical system 431b may convert the cross section of the beam of illuminating light output from the light source 431a to be elliptical, and focus the converted illuminating light within the droplet detecting region K. The cross section of the beam of illuminating light within the presumed trajectory range Pa may be an ellipse having a major axis that substantially matches the X direction. In addition, the length of the minor axis of the elliptical cross section of the illuminating light beam may be substantially the same as the diameter of the droplets 271. Note that in FIG. 14A and FIG. 14B, the range of the presumed trajectory range Pa is illustrated larger than actual size to facilitate viewing, but may be smaller than the illustrated range.

The length along the X direction of the elliptical cross section of the illuminating light beam may be determined based on the droplet detecting region K.

The direction of the major axis of the elliptical cross section of the illuminating light beam may substantially match the predetermined direction, which is a direction substantially parallel to the two dimensional plane along which the target supply unit 26 is capable of moving, and perpendicular to the detecting optical axis.

The droplets 271 may be detected by the droplet detector 43 by traveling along the droplet trajectory F and reaching the presumed trajectory range Pa between the light source unit 431 and the light receiving unit 432. When the droplets 271 travel in the −Y direction and reach the presumed trajectory range Pa, the droplets 271 may shield a portion of the light which is output from the light source unit 431 toward the light receiving unit 432, as illustrated in FIG. 14C. Thereby, the amount of light that enters the light receiving unit 432 changes.

Cases in which the droplet trajectory F shifts in the X direction may occur, as illustrated in FIG. 14C. Such shifts may be caused by changes in the conditions (such as wetting properties) in the vicinity of the nozzle aperture 262a of the target supply unit 26. In addition, such shifts may be caused by movement of the target supply unit 26 by the stage 74. Cases in which the droplet trajectory F passes through the approximate center of the presumed trajectory range Pa (trajectory A), and cases in which the droplet trajectory F passes positions which are slightly shifted from the center of the presumed trajectory range Pa in the X direction (trajectory B, trajectory C) are possible. In addition, cases in which the droplet trajectory F passes through the vicinities of the end portions of the presumed trajectory range Pa (trajectory D) are also possible.

The amount of time during which the droplets 271 shield a portion of the illuminating light output from the light source unit 431 will become slightly shorter in cases that the droplet trajectory F passes through positions which are slightly shifted from the center of the presumed trajectory range Pa in the X direction (trajectory B, trajectory C) compared to a case in which the droplet trajectory F passes through the approximate center of the presumed trajectory range Pa (trajectory A). The amount of time during which the droplets 271 shield a portion of the illuminating light output from the light source unit 431 will become even shorter in cases that the droplet trajectory F passes through the vicinities of the end portions of the presumed trajectory range Pa (trajectory D).

Based on the above, shifts in the timings at which the droplets 271 reach the presumed trajectory range Pa can be maintained slight even in cases that the droplet trajectory F becomes shifted in the X direction, because the cross sectional shape of the illuminating light beam in the presumed trajectory range Pa is elliptical.

Note that with respect to the other components of the droplet detector 43 of the third embodiment, they may be the same as the components of the droplet detectors illustrated in FIG. 2, FIG. 3, FIG. 5A, FIG. 6, and FIG. 12.

[8.2 Operation]

The operations of the calculation control unit 51 of the EUV light generating apparatus 1 equipped with the droplet detector 43 of the third embodiment will be described with reference to FIG. 14D. FIG. 14D is a time chart that illustrates timings up to a point when a droplet detection signal is generated by the calculation control unit 51 of the EUV light generating apparatus 1 equipped with the droplet detector 43. Descriptions of the operations of the calculation control unit 51 illustrated in FIG. 14D which are the same as those with reference to FIG. 4 and FIG. 13 will be omitted.

The droplet detector 43 may change the passage timing signals which are output to the calculation control unit 51 by the droplets 271 reaching the presumed trajectory range Pa.

The calculation control unit 51 may generate droplet detection signals Sc based on the passage timing signals output from the droplet detector 43, as illustrated in FIG. 14D. As illustrated in FIG. 14D, the shifts in the timings at which the passage timing signals which are output from the droplet detector 43 change are slight, even if the droplet trajectory F shifts in the X direction. As a result, shifts in the timings at which the droplet detection signals Sc are generated will also become slight.

Note that the other operations of the droplet detector 43 of the third embodiment may be the same as those of the droplet detectors illustrated in FIG. 4 and FIG. 13.

[8.3 Effect]

In the EUV light generating apparatus 1 of the third embodiment, shifts in the timings at which droplet detection signals are generated can be maintained slight even in cases that the droplet trajectory F becomes shifted in the X direction, because the droplet detector 43 causes the cross sectional shape of the illuminating light beam in the presumed trajectory range Pa to be elliptical. As a result, shifts in the timings at which the laser apparatus 3 outputs the pulsed laser beam will also be slight, even in cases that the trajectory of the droplets 271 becomes shifted in the X direction.

[9. Droplet Detector and Calculation control Unit Included in EUV Light Generating Apparatus According to Fourth Embodiment]

[9.1 Configuration]

The configuration of a droplet detector 44 included in an EUV light generating apparatus 1 according to a fourth embodiment will be described with reference to FIG. 15A through FIG. 15C. The droplet detector 44 of the fourth embodiment may be a different embodiment of the droplet detector 41 of the first embodiment, the droplet detector 42 of the second embodiment, and the droplet detector 43 of the third embodiment. With respect to the configuration of the droplet detector 44 of the fourth embodiment, descriptions of components which are the same as those of the droplet detectors illustrated in FIG. 2, FIG. 3, FIG. 5A, FIG. 6, FIG. 12, FIG. 14A, FIG. 14B, and FIG. 14C will be omitted.

A light receiving unit 442 may include a photodetector 442a, a light receiving optical system 442b, a window 442c, and a slit plate 442d. The slit plate 442d may be provided substantially perpendicular with respect to a detecting optical axis. An elongate rectangular slit 442e that extends in the X direction may be formed in the slit plate 442d.

The slit plate 442d causes light that enters the slit 442e to pass therethrough toward the side of the photodetector 442a, and restricts passage of light that reaches the periphery of the slit 442e. Light that passes through the slit 442e may be detected by the photodetector 442a.

The light receiving optical system 442b may be constituted by optical elements, such as a plurality of lenses (convex lenses). The light receiving optical system 442b may be configured to form images of the shadows of the droplets 271 that pass through the presumed trajectory range Pa along the droplet trajectory F and are irradiated by illuminating light from a light source unit 441 at the position of the slit 442e. The images which are formed at the position of the slit 442e by the light receiving optical system 442b may be inverted images of the droplets 271.

Figure 15A:
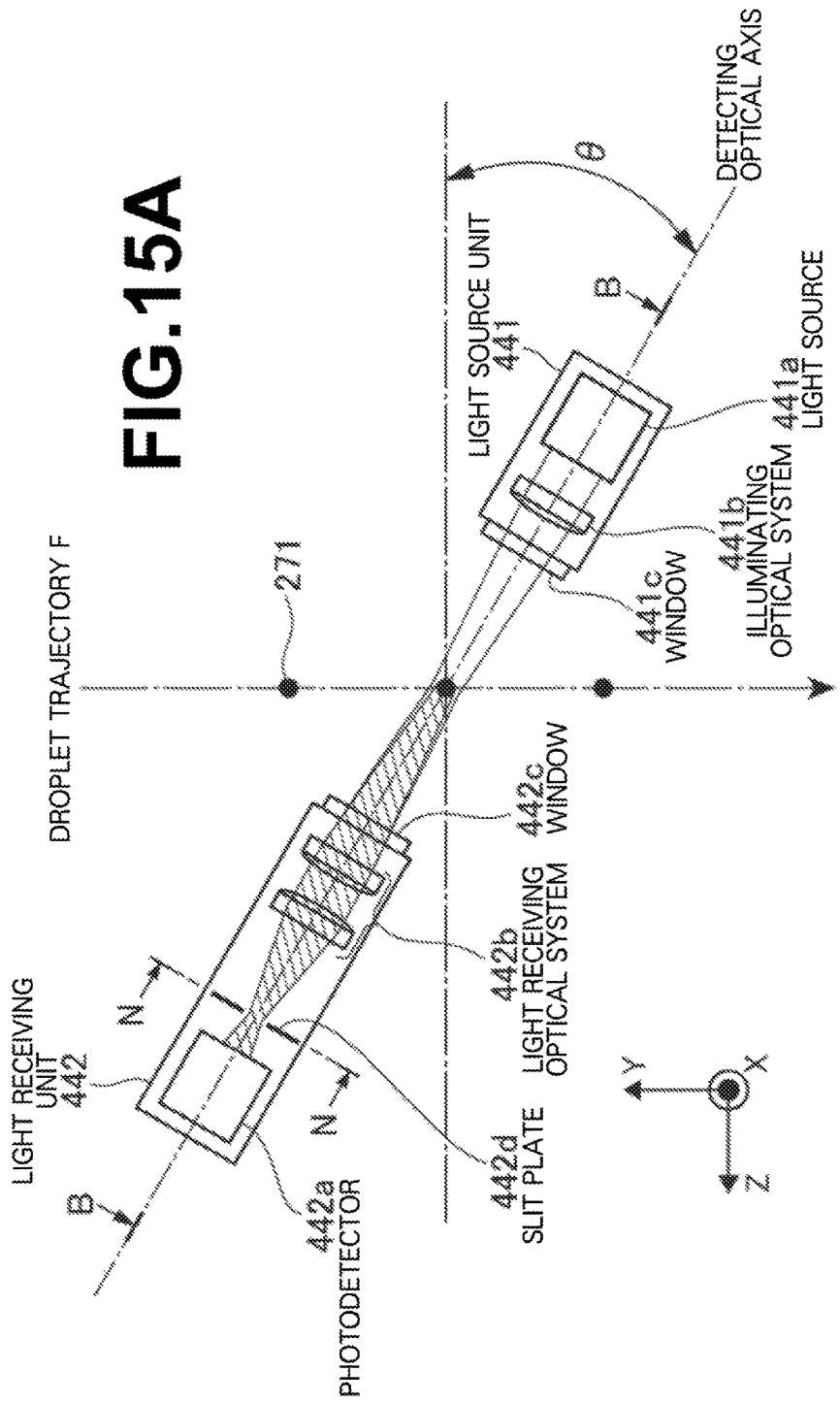
FIG. 15A is a magnified view of a droplet detector according to a fourth embodiment.
Figure 15B:
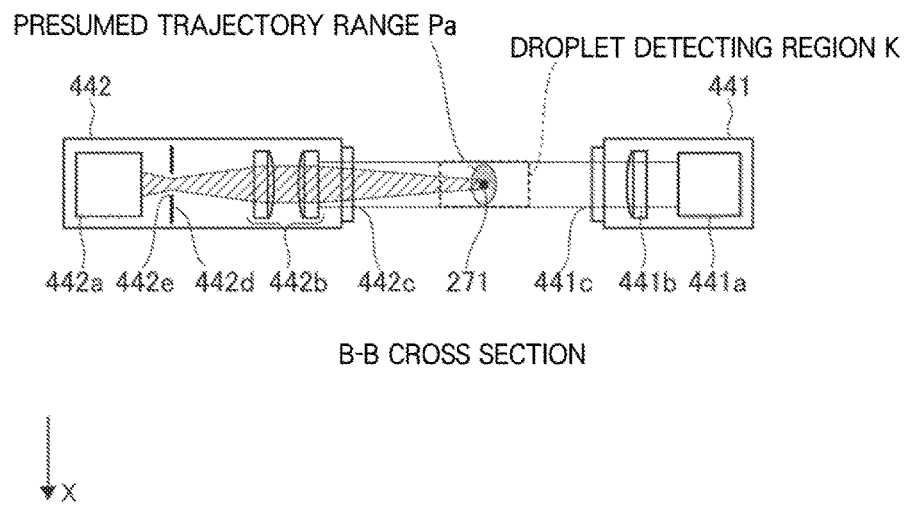
FIG. 15B is a sectional view of the droplet detector taken along the B-B line in FIG. 15A.

Here, FIG. 15B is a cross sectional view of the droplet detector 44 of FIG. 15A taken along the line B-B as viewed from the upstream side of the direction of travel of the droplets 271. FIG. 15C is a cross sectional view taken along the line N-N, which is substantially perpendicular to the propagating direction of the light that passes through the slit plate 442d.

Figure 15C:
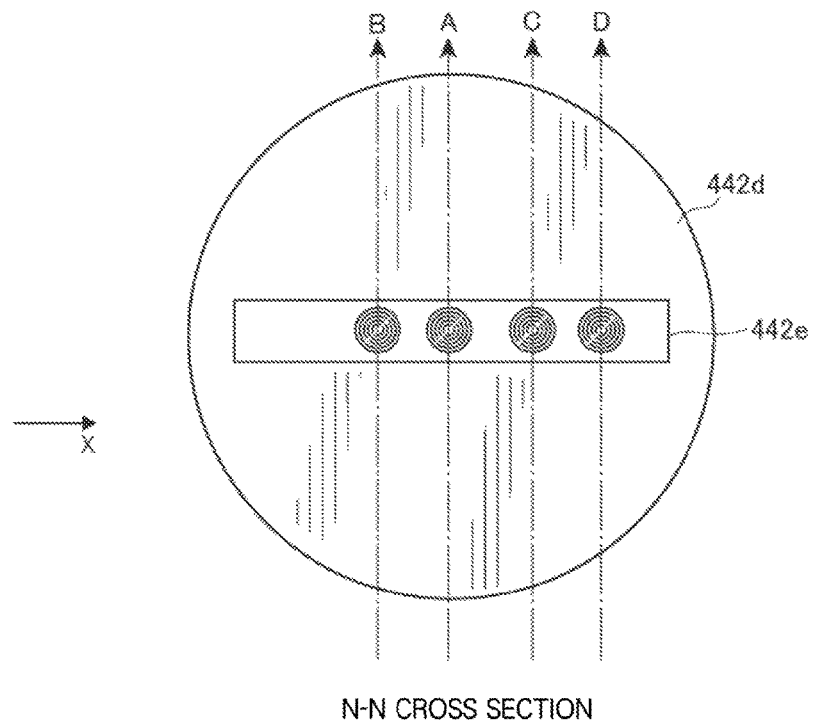
FIG. 15C is a sectional view of a slit plate taken along the N-N line in FIG. 15A.

The images of the droplets 271 are formed as inverted images at the position of the slit 442e as illustrated in FIG. 15C. Therefore, in the case that the droplets 271 travel in the −Y direction, the images of the droplets 271 will move to the upward direction in FIG. 15C. That is, the images of the droplets 271 move from positions at the lower portion of FIG. 15C to positions at the upper portion of FIG. 15C and pass through the position of the slit 442e therebetween.

As illustrated in FIG. 15C, when the images of the droplets 271 reach the position of the slit 442e, the droplets 271 shield the light, and the amount of light that passes through the slight 442e will decrease. At this time, the amount of light received by light receiving element of the photodetector 442a will decrease.

The droplet detector 44 may generate passage timing signals based on changes in the amount of light received by the photodetector 442a when the images of the droplets 271 reach the position of the slit 442e.

The slit 442e may be of an elongate rectangular shape that extends in the X direction, as illustrated in FIG. 15C. With respect to the shape of the slit 442e, the length of the long side may be determined based on a droplet detecting region K, which is larger than a presumed trajectory range Pa. In the shape of the slit 442e, the length of the short side may be substantially the same as the diameter of the droplets 271. By the slit 442e being of such a shape, shifts in the timings at which the images of the droplets 271 are generated at the slit 442e will be suppressed, even if the droplet trajectory F shifts in the X direction.

Note that with respect to the other components of the droplet detector 44 of the fourth embodiment, they may be the same as the components of the droplet detectors illustrated in FIG. 2, FIG. 3, FIG. 5A, FIG. 6, FIG. 12, and FIG. 14A through FIG. 14C.

[9.2 Operation]

Figure 15D:
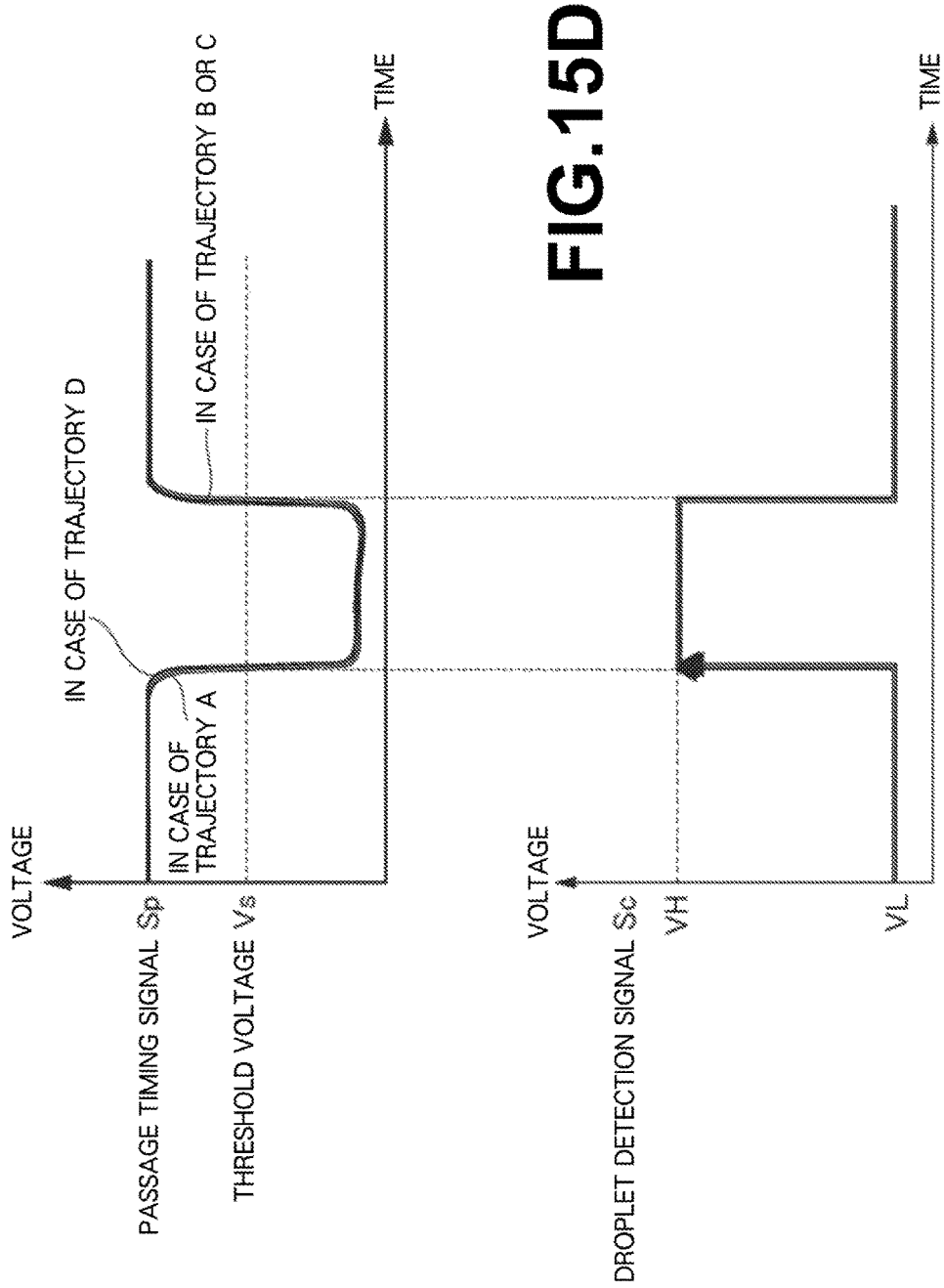
FIG. 15D illustrates the waveforms of passage timing signals and the like which are generated by a photodetector illustrated in FIG. 15A.

The operations of the calculation control unit 51 of the EUV light generating apparatus 1 equipped with the droplet detector 44 of the fourth embodiment will be described with reference to FIG. 15D. FIG. 15D is a time chart that illustrates timings up to a point when a droplet detection signal is generated by the calculation control unit 51 of the EUV light generating apparatus 1 equipped with the droplet detector 44. Descriptions of the operations of the calculation control unit 51 illustrated in FIG. 15D which are the same as those described with reference to FIG. 4, FIG. 13, and FIG. 14D will be omitted.

The droplet detector 43 may change the passage timing signals which are output to the calculation control unit 51 by the droplets 271 reaching the presumed trajectory range Pa.

The calculation control unit 51 may generate droplet detection signals Sc based on the passage timing signals output from the droplet detector 44, as illustrated in FIG. 15D. As illustrated in FIG. 15D, the shifts in the timings at which the passage timing signals which are output from the droplet detector 44 change are suppressed, even if the droplet trajectory F shifts in the X direction. As a result, shifts in the timings at which the droplet detection signals Sc are generated will also be suppressed.

Note that the other operations of the droplet detector 44 of the fourth embodiment may be the same as those of the droplet detectors illustrated in FIG. 4, FIG. 13, and FIG. 14D.

[9.3 Effect]

The EUV light generating apparatus 1 of the fourth embodiment is provided with the slit plate 442d having the rectangular slit 432e within the droplet detector 44. Therefore, the timings at which the passage timing signals change can be maintained substantially constant even if the passage position of the droplets 271 changes in the X direction. Accordingly, changes in the timings at which the pulsed laser beam 33 is irradiated onto the droplets 271 which have reached the plasma generating region 25 can be suppressed, even if the passage position of the droplets 271 change in the X direction.

[10. Image Measuring Device Included in EUV Light Generating Apparatus According to Fifth Embodiment]

[10.1 Configuration]

Figure 16:
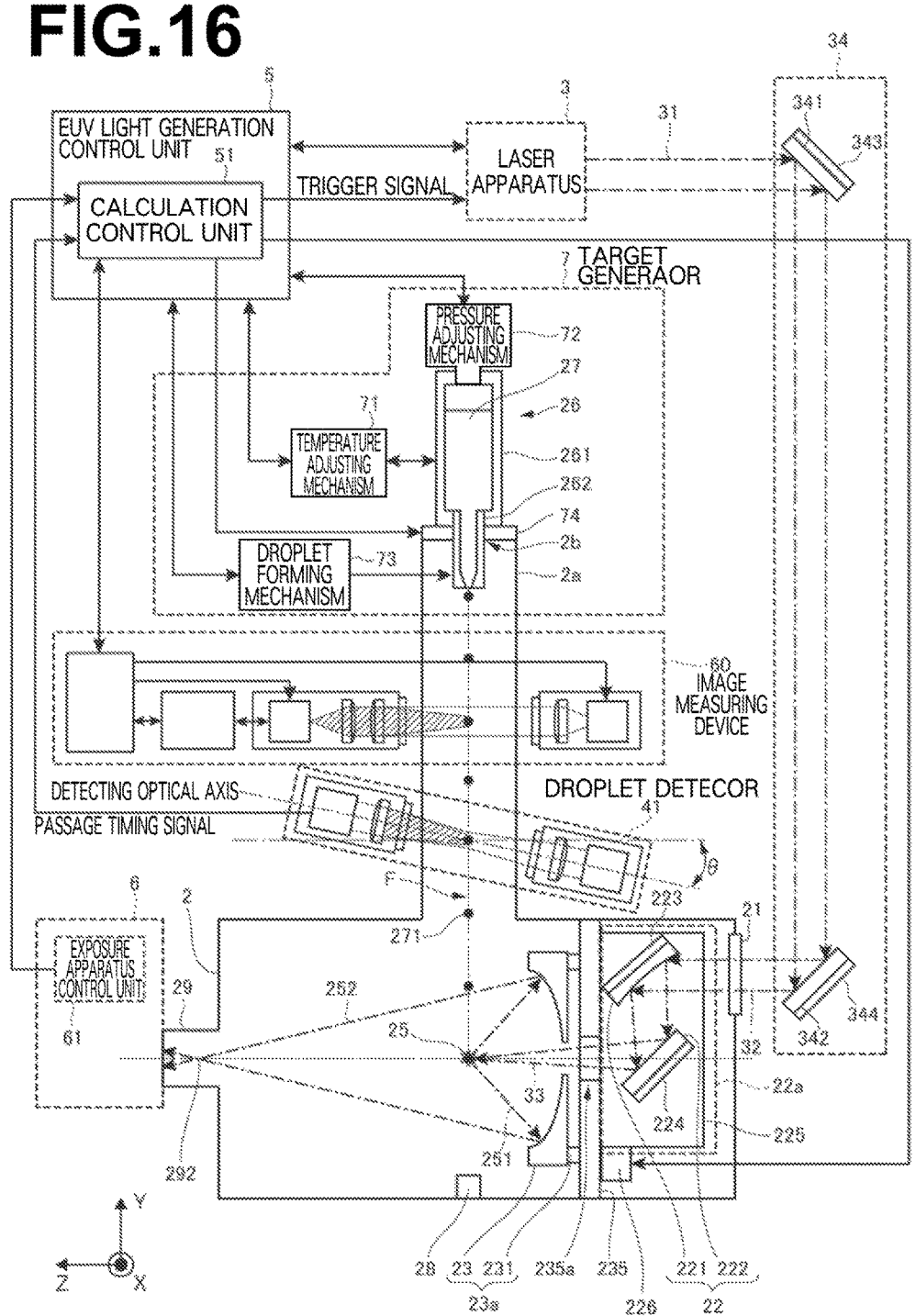
FIG. 16 is a diagram for explaining the configuration of an EUV light generating apparatus according to a fifth embodiment.
Figure 17:
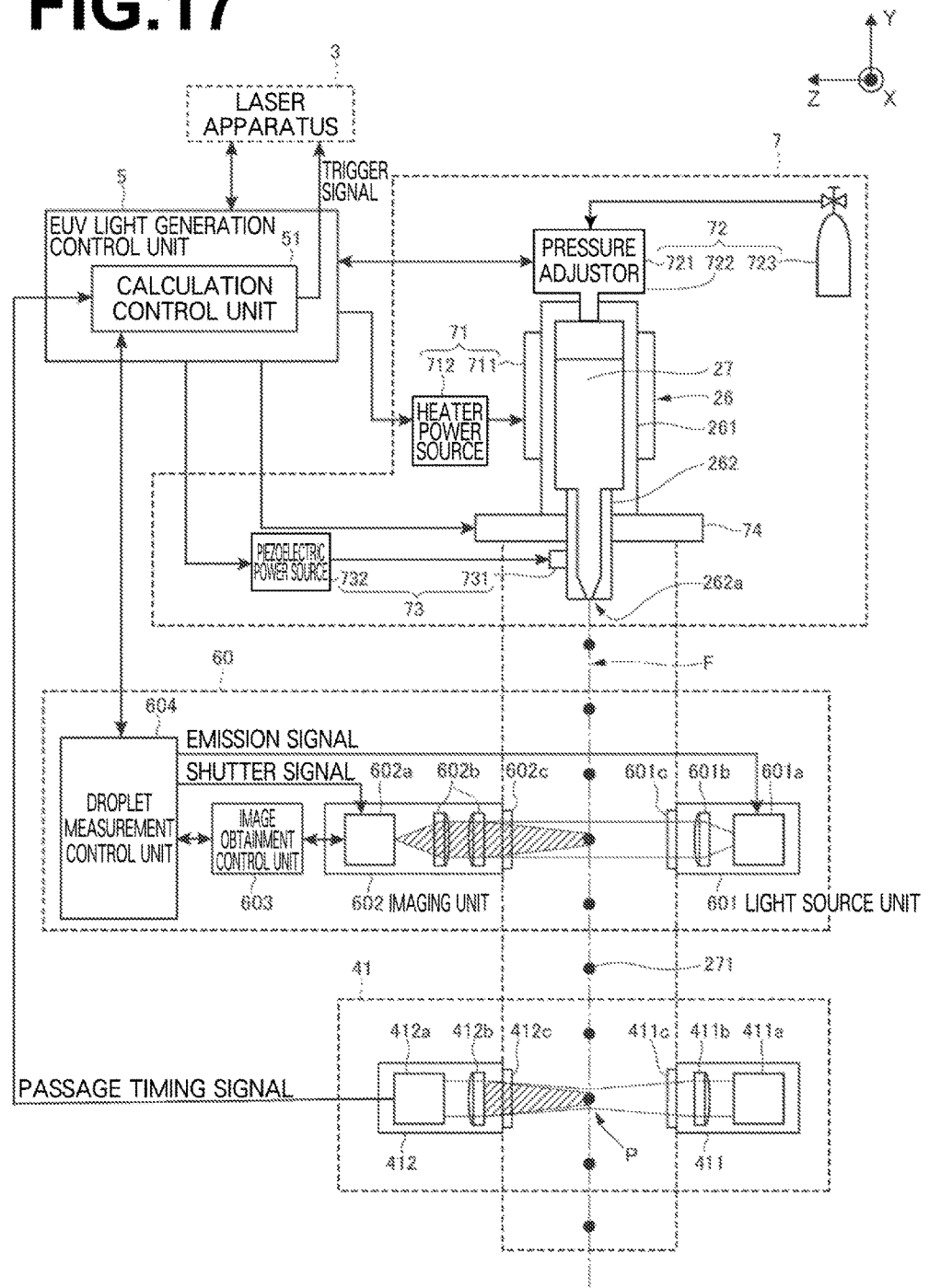
FIG. 17 is a diagram for explaining the configuration of an image measuring device included in the EUV light generating apparatus illustrated in FIG. 16.

The configuration of an image measuring device 60 included in an EUV light generating apparatus 1 according to a fifth embodiment will be described with reference to FIG. 16 and FIG. 17.

The configuration of a target generator 7 of the fifth embodiment may be the same as that of the target generators 7 illustrated in FIG. 2, FIG. 3, and FIG. 6. The configuration of a droplet detector 41 of the fifth embodiment may be the same as that of the droplet detector 41 illustrated in FIG. 5A and FIG. 6. Alternatively, the droplet detector 41 of the fifth embodiment may be replaced by the droplet detector 42, 43, or 44 illustrated in FIG. 12, FIG. 14A, FIG. 14B, FIG. 15A, and FIG. 15B. The configuration of a calculation control unit 51 of the fifth embodiment may be the same as that of the calculation control unit 51 illustrated in FIG. 6.

Note that with respect to the configuration of the droplet detector 41 of the fifth embodiment, descriptions of components which are the same as those of the droplet detector 41 illustrated in FIG. 2, FIG. 3, FIG. 5A, and FIG. 6 will be omitted. In addition, descriptions of the components of the calculation control unit 51 of the fifth embodiment which are the same as those of the calculation control unit 51 illustrated in FIG. 6 will be omitted.

The EUV light generation control unit 5 may control the operations of the target generator 7, the droplet detector 41, and an image measuring device 60. Signals related to image data may be input from the image measuring device 60 to the calculation control unit 51.

The image measuring device 60 may image the droplets 271 along the droplet trajectory F within the chamber 2, and generate image data thereof.

The image measuring device 60 may be equipped with a light source unit 601, an imaging unit 602, an image obtainment control unit 603, and a droplet measurement control unit 604. The image measuring device 60 may be provided between the nozzle 262 and the droplet detector 41. The light source unit 601 and the imaging unit 602 may be provided to face each other with the droplet trajectory F of the droplets 271 which are output into the chamber 2 interposed therebetween. The direction in which the light source unit 601 and the imaging unit 602 face each other may be substantially perpendicular to the droplet trajectory F.

The light source unit 601 may irradiate, with pulsed light, the droplets 271 that travel along the droplet trajectory F. The light source unit 601 may include a light source 601a, an illuminating optical system 601b, and a window 601c.

The light source 601a may be a light source that emits pulsed light, such as a xenon flash lamp and a laser light source. The time from initiation to cessation of light emission of the light source 601a included in the light source unit 601 will also be referred to as "emission time $\Delta T$". The emission time $\Delta T$ of the light source 601a may be a predetermined amount of time within a range from 1 µs to 5 µs, for example, in the case that a generation frequency at which the droplets 271 are output into the chamber is 100 kHz. The light source 601a may be connected to the droplet measurement control unit 604. The light source 601a may perform pulsed emission based on emission signals output from the droplet measurement control unit 604, to emit pulsed light.

The illuminating optical system 601b may be an optical system such as a collimator, and may be constituted by optical elements such as lenses. The illuminating optical system 60 1b may guide the pulsed light emitted by the light source 601a onto the droplet trajectory F via the window 601c.

The light source unit 601 is capable of emitting the pulsed light toward the droplet trajectory F based on the emission signals output from the droplet measurement control unit 604 by the configurations described above. The pulsed light emitted from the light source unit 601 can be irradiated onto the droplets 271 that travel along the droplet trajectory F between the light source unit 601 and the imaging unit 602.

The imaging unit 602 may capture images of the shadows of the droplets 271 which are irradiated by the pulsed light from the light source 601. The imaging unit 602 may include an image sensor 602a, a transfer optical system 602b, and a window 602c.

The transfer optical system 602b may be optical elements, such as a pair of lenses. The transfer optical system 602b may form images of the shadows of the droplets 271 guided thereto via the window 602c onto a light receiving surface of the image sensor 602a.

The image sensor 602a may be a two dimensional image sensor such as a CCD (Charge Coupled Device) and a CMOS (Complementary Metal Oxide Semiconductor). The image sensor 602a may be equipped with a shutter, which is not illustrated. The image sensor 602 may capture images of the shadows of the droplets 271 which are formed by the transfer optical system 602b. The temporal imaging intervals of the image sensor 602a may be sufficiently longer than the emission time ΔT of the light source 601a. The temporal imaging intervals of the image sensor 602a may be within a range from 0.1 s to 1 s, for example. Note that the temporal imaging interval of the image sensor 602a included in the imaging unit 602 will also be referred to as a "measurement interval K" of the image measuring device 60.

The image sensor 602a may be connected to the droplet measurement control unit 604. The image sensor 602a may open and close the shutter based on shutter signals from the droplet measurement control unit 604, to capture images of the shadows of the droplets 271. The image sensor 602a may be configured to capture image only during periods of time when the shutter, which is not illustrated, is open. The shutter may be an electric shutter or a mechanical shutter. Note that the amount of time required for one image capturing operation by the image sensor 602a included in the imaging unit 602, that is, the amount of time from when the shutter opens until it closes, will also be referred to as a single "imaging time Δt".

The image sensor 602a may be connected to the image obtainment control unit 603. The image sensor 602a may output image signals related to the obtained images of the shadows of the droplets 271 to the image obtainment control unit 603 for each imaging operation.

The image obtainment control unit 603 may generate image data such as bit map data related to the images of the shadows of the droplets 271, from image signals which are output from the image sensor 602a. The image obtainment control unit 603 may correlate the generated image data with identifying data for the image data, and store the correlated data. The identifying data for the image data may be data related to the time at which the image data are generated. The image obtainment control unit 603 may be connected to the droplet measurement control unit 604. The image obtainment control unit 603 may output the generated image data and identifying data thereof to the droplet measurement control unit 604, based on control signals from the droplet measurement control unit 604. Note that the hardware configuration of the image obtainment control unit 603 will be described later with reference to FIG. 20.

The droplet measurement control unit 604 may output emission signals and shutter signals to, the light source unit 601 and the imaging unit 602, to control the operations of the light source unit 601 and the imaging unit 602.

The droplet measurement control unit 604 may store the image data and the identifying data thereof, which are output from the image obtainment control unit 603. The droplet measurement control unit 604 may store programs for calculating parameters related to the state of the droplets 271, such as the velocity of travel v of the droplets 271, based on the image data in a memory, which is not illustrated. The droplet measurement control unit 604 may calculate the above parameters based on the image data which are output form the image obtainment control unit 603.

The parameters which are calculated employing the above programs may be physical quantities that represent the dynamic states of the droplets 271 which are output into the chamber 2. For example, the parameters may include the diameters D, the velocity of travel v, and the intervals d of the droplets 271 that travel within the chamber 2.

In the case that the image measuring device 60 is fixed to the chamber 2, the imaging unit 602 included in the image measuring device 60 is capable of fixed point observation of a specific range along the droplet trajectory F. The position of the droplets 271 in the Y direction may be a relative position within an imaging range in the direction of travel of the droplets 271. The position of the droplets 271 in the Y direction may be the position of the droplets 271 in a direction substantially parallel to the direction of travel of the droplets 271 in the captured image data.

The intervals d among the droplets 271 are the intervals among adjacent droplets 271 which are sequentially output into the chamber 2 from the target supply unit 26, and may be intervals in the direction of travel of the droplets 271.

The droplet measurement control unit 604 may execute processes related to control of the light source unit 601 and the imaging unit 602, obtainment of image data, and calculation of parameters, without receiving commands from the EUV light generation control unit 5. Note that the hardware configuration of the droplet measurement control unit 604 will be described later with reference to FIG. 20.

The image measuring device 60 is capable of capturing images of the droplets 271 which are output into the chamber 2 from the target supply unit 26 and obtaining image data thereof, by the configurations described above. The image measuring device 60 is capable of calculating parameters such as the velocity of travel v of the droplets 271 from the obtained image data, and outputting the parameters to the calculation control unit 51 of the EUV light generating control unit 5.

Note that the other components of the EUV light generating apparatus 1 of the fifth embodiment may be the same as those of the EUV light generating apparatuses 1 illustrated in FIG. 2 and FIG. 6.

[10.2 Operation]

Figure 18:
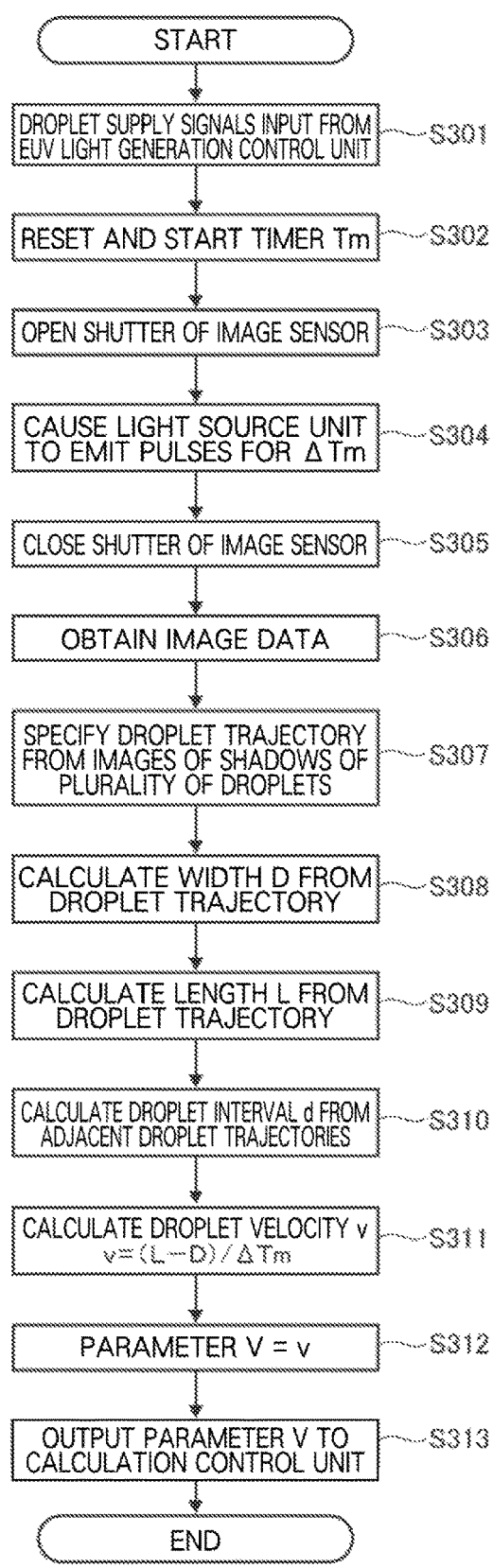
FIG. 18 is a flow chart for explaining a droplet velocity measuring process performed by a droplet measuring/control unit illustrated in FIG. 17.
Figure 19:
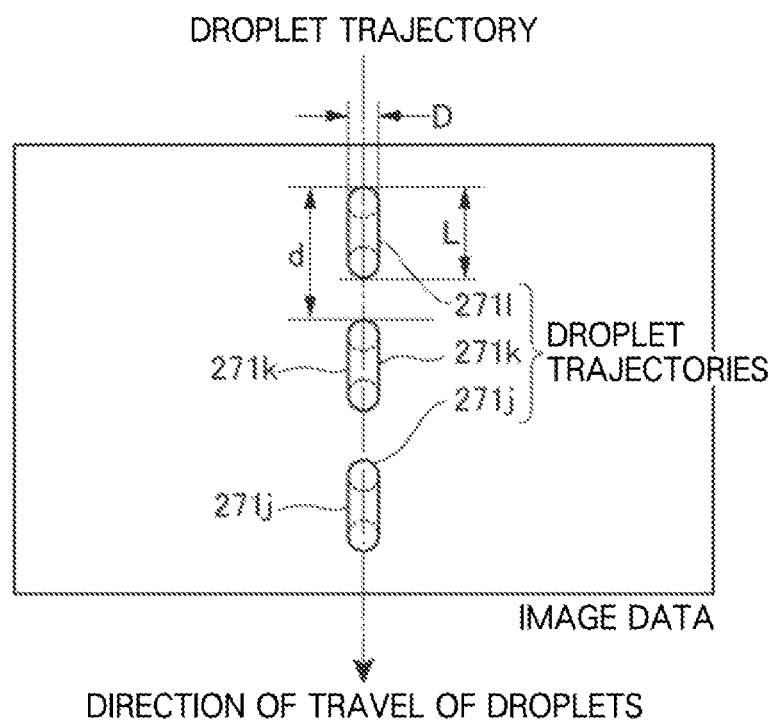
FIG. 19 illustrates an image of droplets which are imaged by an imaging unit of the image measuring device illustrated in FIG. 17.

The operations of the droplet measurement control unit 604 included in the EUV light generating apparatus 1 of the fifth embodiment will be described with reference to FIG. 18 and FIG. 19. The fifth embodiment may apply the velocity (v) which is calculated from the image data obtained by the image measuring device 60 as data related to the velocity (V) of the droplets 271 which is employed in the Y position correcting process of step S93 illustrated in FIG. 9 and the Z position correcting process of step S115 illustrated in FIG. 10.

The operations illustrated in FIG. 18 may be operations which are performed by the droplet measurement control unit 604 of the image measuring device 60 described with reference to FIG. 16 and FIG. 17, to calculate the velocity (V) of the droplets 271. First, the operations related to the droplet velocity calculating process will be described with reference to FIG. 18.

At step S301, droplet supply signals output from the EUV light generation control unit 5 may be input to the droplet measurement control unit 604.

At step S302, The droplet measurement control unit 60 may reset a timer T and start measuring time with a timer Tm.

At step S303, the droplet measurement control unit 60 may output a shutter signal to open the shutter of the image sensor 602a of the imaging unit 602 to the image sensor 602a. The droplet measurement control unit 60 may store the value of the timer Tm at the time when the shutter signal to open the shutter is output.

At step S304, the droplet measurement control unit 604 may output an emission signal for a predetermined emission time ΔTm to the light source 601a to cause the light source 601a of the light source unit 601 to emit light. The light source 601a may emit pulsed light onto the droplet trajectory F during the emission time ΔTm.

At step S305, the droplet measurement control unit 604 may output a shutter signal to close the shutter of the image sensor 602*a* after a predetermined imaging time Δtm elapses from the time Tm. The imaging time Δtm may be the amount of time from when the shutter of the image sensor 602*a* is opened at step S303 until the shutter is closed at step S305. The image sensor 602*a* is capable of capturing an image of the shadows of droplets 271 which were formed as images during the imaging time Δtm. The droplet measurement control unit 604 may store the value of the timer Tm when the shutter signal is output, in order to determine the timing at which the shutter is to be closed.

At step S306, the droplet measurement control unit 604 may obtain image data (refer to FIG. 19) related to the image of the shadows of the droplets 271 which are captured at step S305 from the image obtainment control unit 603.

At step S307, the droplet measurement control unit 604 may specify the trajectory of one droplet 271 from the image of the shadows of a plurality of droplets 271 included in the image data obtained at step S306. The trajectory of the one droplet 271 may correspond to the trajectory of the droplet 271*l* illustrated in FIG. 19, for example.

At step S308, the droplet measurement control unit 604 may calculate the diameter D of the droplets 271 from the trajectory which is specified at step S307. The droplet measurement control unit 604 may designate the width of the trajectory in a direction substantially perpendicular to the direction of travel of the droplets 271 as the diameter D of the droplets 271.

At step S309, the droplet measurement control unit 604 may calculate the length L of the trajectory which is specified at step S307. The length L of the trajectory may be the length of the trajectory of the droplet 271 in the direction of travel of the droplet 271.

At step S310, the droplet measurement control unit 604 may calculate the interval d from the trajectories of two adjacent droplets 271 which have been sequentially output. The trajectories of two adjacent droplets 271 which have been sequentially output may be, for example, the trajectory 271*l* which was specified in step S307, and the trajectory 271*k* immediately adjacent thereto, in FIG. 19. The interval d may be an interval between two droplets 271 in the direction of travel thereof. For example, in FIG. 19, the interval d may be the interval between the trajectory 271*k* and the trajectory 271*l* in the direction of travel of the droplets 271.

At step S311, the droplet measurement control unit 604 may calculate the velocity v of the droplets 271 based on the diameter D calculated at step S308 and the length L calculated at step S309. The droplet measurement control unit 604 may calculate the velocity v of the droplets 271 according to the formula below.

$$v=(L-D)/\Delta Tm$$

(L−D) at the right side represents the distance that one droplet 271 has traveled during the emission time ΔTm.

At step S312, the droplet measurement control unit 604 may set the velocity v of the droplets 271 calculated at step S311 as parameter (V)=v. In addition, the droplet measurement control unit 604 may obtain image data a plurality of times, calculate an average value of velocities v which are calculated from the plurality of obtained image data, and set the average value as the parameter (V).

At step S313, the droplet measurement control unit 604 may output the parameter (V) set at step S312 to the calculation control unit 51 of the EUV light generation control unit 5. The calculation control unit 51 may employ the velocity of the droplets 271 (parameter (V)) output from the droplet measurement control unit 604 in the Y position correcting process at step S93 of FIG. 9 and in the Z position correcting process at step S115 in FIG. 10.

Note that the other operations of the EUV light generating apparatus 1 of the fifth embodiment may be the same as those of the EUV light generating apparatuses 1 illustrated in FIG. 7 through FIG. 11.

[10.3 Effect]

The EUV light generating apparatus 1 of the fifth embodiment is capable of progressively obtaining image data of the droplets 271 with the image measuring device 60. As a result, the velocity of the droplets 271 can be progressively calculated from the image data. For this reason, the accuracy of the data related to the velocity of the droplets 271 which is employed to update the delay time Tdl is improved. Therefore, the calculation of the delay time Tdl can be performed more accurately, employing appropriate data regarding the velocity of the droplets 271. Accordingly, the pulsed laser beam 33 can be irradiated onto the droplets 271 at optimal timings, even in cases that the target supply unit 26 is moved.

[11. Hardware Environment of Control Units]

Those skilled in the art would understand that the matters described above can be executed by combining a general purpose computer or a programmable controller with a program module or a software application. Generally, the program module will include routines, programs, components, and data structures, etc., for executing the processes described in the present disclosure.

Figure 20:
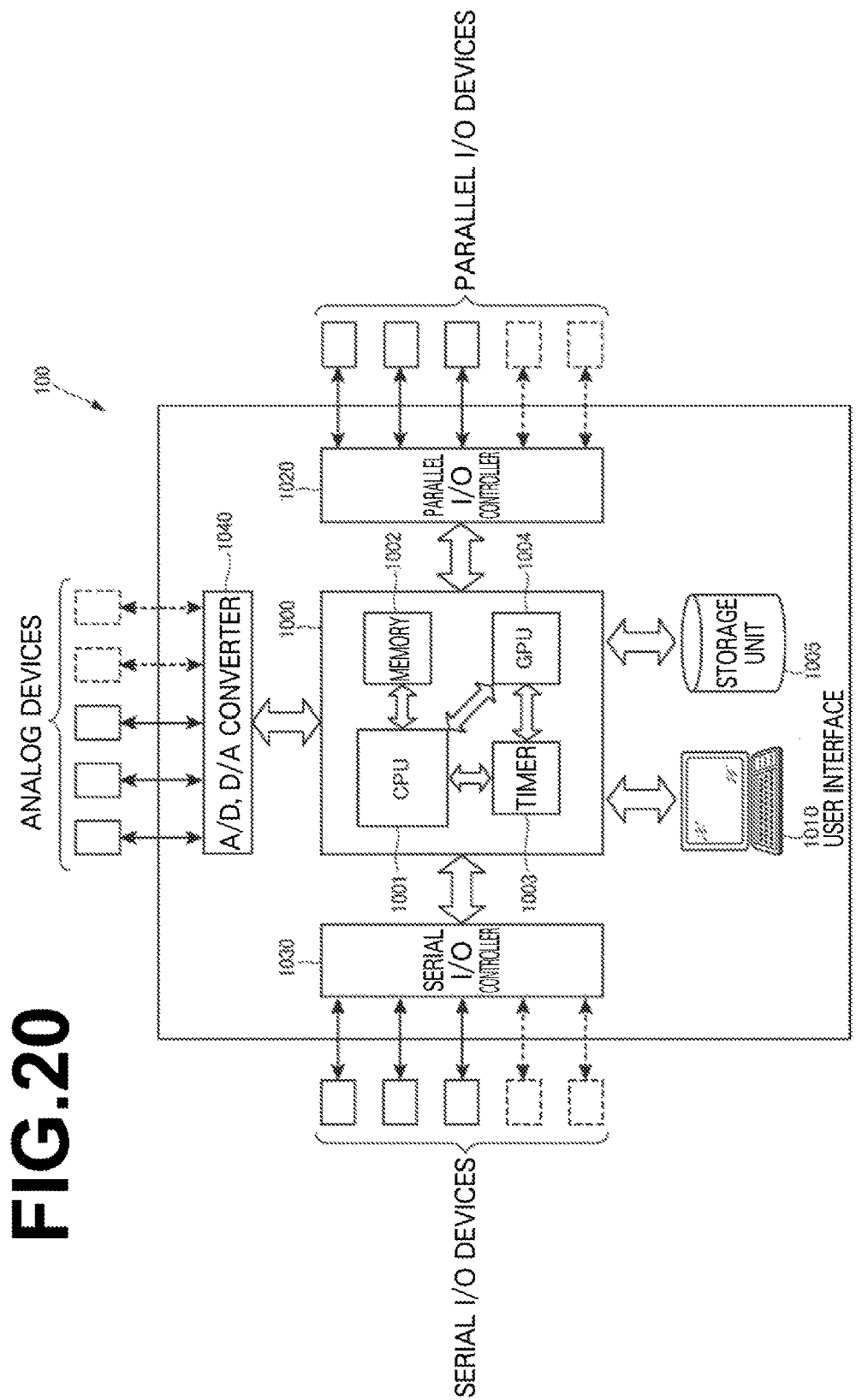
FIG. 20 is a block diagram that illustrates the hardware environments of control units.

FIG. 20 is a block diagram that illustrates an exemplary hardware environment in which various aspects of the present disclosure can be implemented. The exemplary hardware environment 100 illustrated in FIG. 20 may include a processing unit 1000, a storage unit 1005, a user interface 1010, a parallel I/O controller 1020, a serial I/O controller 1030, and an A/D, D/A converter 1040. However, the configuration of the hardware environment 100 is not limited to that described above.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially available processor. A dual microprocessor or any other multiprocessor architecture may be employed as the CPU 1001.

The components illustrated in FIG. 20 may be interconnected with each other to execute the processes described in the present disclosure.

During operation, the processing unit 1000 may read and execute programs stored in the storage unit 1005, read data together with the programs from the storage unit 1005, and write data to the storage unit 1005. The CPU 1001 may execute programs read out from the storage unit 1005. The memory 1002 may be a work area in which programs executed by the CPU 1001 and data used in the operation of the CPU 1001 are temporarily stored. The timer 1003 may measure temporal intervals and output the results of measurement to the CPU 1001 according to the execution of programs. The GPU 1004 may process image data according to programs read from the storage unit 1005, and output the results of processing to the CPU 1001.

The parallel I/O controller 1020 may be connected to parallel I/O devices which are capable of communicating with the processing unit 1000, such as the exposure apparatus control unit 61, the EUV light generation control unit 5, the calculation control unit 51, the image obtainment control unit 603, the droplet measurement control unit 604, and the laser beam propagating direction control unit 34. The parallel I/O controller 1020 may control communications among the processing unit 1000 and the parallel I/O devices. The serial I/O controller 1030 may be connected to serial I/O devices which are capable of communicating with the processing unit 1000, such as the heater power source 712, the piezoelectric power source 732, the pressure adjustor 721, the light source 411a, the light source 421a, the light source 431a, the light source 441a, the stage 74, and the manipulator 226. The serial I/O controller 1030 may control communications among the processing unit 1000 and the serial I/O devices. The A/D, D/A converter 1040 may be connected to analog devices, including various sensors such as a temperature sensor, a pressure sensor, a vacuum meter, the target sensor 4, the photodetector 412a, the photodetector 422a, the photodetector 432a, the photodetector 442a, and the image sensor 602, via an analog port. The A/D, D/A 1040 converter may control communications among the processing unit 1000 and the analog devices, and perform A/D as well as D/A conversion of the contents of the communications.

The user interface 1010 may display the progress of programs which are being executed by the processing unit 1000 to an operator, such that the operator can command the processing unit 1000 to cease executing programs or to execute interruption routines.

The exemplary hardware environment 100 may be applied to the configurations of the exposure apparatus control unit 61, the EUV light generation control unit 5, the calculation control unit 51, the image obtainment control unit 603, the droplet measurement control unit 604, and the laser beam propagating direction control unit 34 of the present disclosure. Those skilled in the art would understand that these controllers may also be realized in a distributed computing environment, that is, an environment in which tasks are executed by processing units which are connected to each other via a communications network. In the present disclosure, the exposure apparatus control unit 61, the EUV light generation control unit 5, the calculation control unit 51, the image obtainment control unit 603, the droplet measurement control unit 604, and the laser beam propagating direction control unit 34 may be connected to each other via a communications network such as an Ethernet and the Internet. In a distributed computing environment, program modules may be stored in both local and remote memory storage devices.

It would be obvious to those skilled in the art that the technologies which are described in the above embodiments and the modification may be combined with each other.

The description above is intended to be illustrative and the present disclosure is not limited thereto. Therefore, it would be obvious to those skilled in the art that various modifications to the embodiments of the present disclosure would be possible as long as they do not stray from the spirit and the scope of the appended claims.

The terms which are employed in the present specification and the appended claims are to be interpreted as "no limiting". For example, the terms "include" and "including" are to be interpreted to mean "including the described elements but not limited thereto". The term "have" is to be interpreted to mean "having the described elements but not limited thereto". Further, the indefinite articles "a" and "an", as well as the word "one" in the present specification as well as the appended claims are to be interpreted to mean "at least one" or "one or more".

What is claimed is:

1. An extreme ultraviolet light generating apparatus, comprising:
    a chamber, in which a target supplied into a plasma generating region therein turns into plasma by being irradiated with a laser beam and extreme ultraviolet light is generated;
    a target supply unit configured to output the target into the chamber as droplets so as to supply the target into the plasma generating region;
    a stage that moves the target supply unit in a direction substantially perpendicular to a trajectory of the droplets which are output from the target supply unit based on commands from an external apparatus;
    a droplet detector, equipped with a light source unit and a light receiving unit arranged to face the light source unit, provided between the target supply unit and the plasma generating region such that a direction along which the light source unit and the light receiving unit face each other is at an inclination of a predetermined angle with respect to the direction substantially perpendicular to the trajectory of the droplets, the droplet detector configured to detect the droplets from the direction inclined at the predetermined angle; and
    a calculation control unit configured to control the irradiation timings of the laser beam at which the laser beam is irradiated onto the droplets within the plasm generating region, by adding delay times to the timings at which the droplets are detected by the droplet detector;
    the calculation control unit updating the delay time based on data regarding a distance of movement of the target supply unit based on the commands from the external apparatus and data regarding the predetermined angle.

2. An extreme ultraviolet light generating apparatus as defined in claim 1, wherein:
    the calculation control unit updates the delay time in cases that the direction of movement of the target supply unit is not a predetermined direction, which is parallel to a two dimensional plane along which the target supply unit is capable of moving, and perpendicular to a detecting optical axis along which a light receiving portion of the droplet detector inclined at the predetermined angle is capable of detection.

3. An extreme ultraviolet light generating apparatus as defined in claim 2, wherein:
    the calculation control unit updates the delay time in cases that the direction of movement of the target supply unit includes a direction other than directions within a plane that includes the predetermined direction and the trajectory of the droplets.

4. An extreme ultraviolet light generating apparatus as defined in claim 3, further comprising:
    an image measuring device configured to image the droplets and to calculate a velocity of the droplets, wherein
    the calculation control unit calculates the delay time based on the velocity calculated by the image measuring device.

5. An extreme ultraviolet light generating apparatus as defined in claim 3, further comprising:
    a laser beam focusing optical system configured to focus the laser beam at the plasma generating region; and
    a manipulator configured to move the laser beam focusing optical system based on commands from the exterior, to change the focusing position of the laser beam focusing optical system.

6. An extreme ultraviolet light generating apparatus as defined in claim 3, wherein:
the droplet detector detects the droplets that pass through a region that extends in the predetermined direction.

7. A method for generating extreme ultraviolet light by turning a target to plasma by irradiating the target with a laser beam within a plasma generating region, comprising:
receiving data regarding a specified plasma generating region position for changing the position of the plasma generating region from the exterior;
moving a target supply unit that supplies the target as droplets to the specified plasma generating region position based on the data;
moving a laser beam focusing optical system to focus the laser beam at the specified plasma generating region position based on the data;
outputting the target as the droplets from the target supply unit toward the specified plasma generating region;
detecting the droplets with a droplet detector, equipped with a light source unit and a light receiving unit arranged to face the light source unit, provided such that a direction along which the light source unit and the light receiving unit face each other is at an inclination of a predetermined angle with respect to a direction substantially perpendicular to a trajectory of the droplets which are output from the target supply unit;
calculating a delay time that determines the timings at which trigger signals that cause an external laser device to output the laser beam are output, based on the timings at which the droplets are detected by the droplet detector, the distance of movement of the target supply unit, and the predetermined angle; and
outputting the trigger signals at timings, which are the timings at which the droplets are detected by the droplet detector with the delay time added thereto.

8. An extreme ultraviolet light generating apparatus as defined in claim 4, wherein:
the image measuring device comprises a light source unit and an imaging unit; and
the light source unit and the imaging unit are provided to face each other with the trajectory of the droplets interposed therebetween.

9. An extreme ultraviolet light generating apparatus as defined in claim 8, wherein:
the light source unit outputs pulsed light.

10. An extreme ultraviolet light generating apparatus as defined in claim 8, wherein:
the imaging unit comprises an image sensor having a shutter.

11. An extreme ultraviolet light generating apparatus as defined in claim 8, wherein:
the imaging unit generates identifying data related to a time at which image data are generated, as data for identifying the image data.

12. An extreme ultraviolet light generating apparatus as defined in claim 4, wherein:
the image measuring device calculates a diameter and a trajectory length of a droplet from image data related to the droplet trajectory, and calculates the velocity of the droplet from the diameter and the trajectory length.

13. An extreme ultraviolet light generating apparatus as defined in claim 12, wherein:
the image measuring device obtains the image data a plurality of times, and calculates an average value of the velocity of a droplet, which is obtained from each of the plurality of image data.

14. An extreme ultraviolet light generating apparatus as defined in claim 2, wherein:
the calculation control unit updates the delay time in the case that the distance between the nozzle aperture of the target supply unit and the detecting optical axis of the droplet detector changes.

15. An extreme ultraviolet light generating apparatus as defined in claim 2, wherein:
the light source unit of the droplet detector comprises an illuminating optical system constituted by a planoconvex cylindrical lens; and
the central axis of the convex surface of the planoconvex cylindrical lens is provided to be substantially perpendicular to the detecting optical axis of the droplet detector and a droplet trajectory.

16. An extreme ultraviolet light generating apparatus as defined in claim 1, wherein:
a presumed droplet trajectory range is included in a droplet detecting region.

17. An extreme ultraviolet light generating apparatus as defined in claim 1, wherein:
the light receiving unit comprises a slit plate having an elongate rectangular slit.

* * * * *